(12) United States Patent
Burn et al.

(10) Patent No.: US 8,319,213 B2
(45) Date of Patent: *Nov. 27, 2012

(54) ARYL-ARYL DENDRIMERS

(75) Inventors: Paul Leslie Burn, St. Lucia (AU); Ifor David William Samuel, Fife (GB); Shih-Chun Lo, Oxford (GB)

(73) Assignees: Isis Innovation Limited, Oxford (GB); The University Court of the University of St. Andrews, Fife (GB)

(*) Notice: Subject to any disclaimer, the term of this patent is extended or adjusted under 35 U.S.C. 154(b) by 11 days.

This patent is subject to a terminal disclaimer.

(21) Appl. No.: 13/159,336

(22) Filed: Jun. 13, 2011

(65) Prior Publication Data

US 2011/0272688 A1  Nov. 10, 2011

Related U.S. Application Data

(63) Continuation of application No. 12/626,605, filed on Nov. 25, 2009, now Pat. No. 7,960,725, and a continuation of application No. 10/468,681, filed as application No. PCT/GB02/00739 on Feb. 20, 2002, now Pat. No. 7,632,576.

(30) Foreign Application Priority Data

Feb. 20, 2001 (GB) .................................. 0104177.1

(51) Int. Cl.
*H01L 29/08* (2006.01)
*C07B 47/00* (2006.01)
*C09K 11/06* (2006.01)

(52) U.S. Cl. .............. 257/40; 257/E51.041; 540/145; 252/301.16

(58) Field of Classification Search .................. None
See application file for complete search history.

(56) References Cited

U.S. PATENT DOCUMENTS

| | | |
|---|---|---|
| 5,041,516 A | 8/1991 | Frechet et al. |
| 5,150,006 A | 9/1992 | Van Slyke et al. |
| 5,432,014 A | 7/1995 | Sano et al. |
| 5,972,247 A | 10/1999 | Shi et al. |
| 6,083,634 A | 7/2000 | Shi |
| 6,558,818 B1 | 5/2003 | Samuel et al. |
| 6,632,543 B1 | 10/2003 | Kawamura et al. |
| 6,720,093 B2 | 4/2004 | Samuel et al. |

(Continued)

FOREIGN PATENT DOCUMENTS

EP  1 009 041 A2  6/2000

(Continued)

OTHER PUBLICATIONS

Adachi et al., "High-efficiency Organic Electrophosphorescent Devices with tris(2-phenylpryridine)iridium Doped into Electron-Transporting Materials," *Appl. Phys. Lett.*, 77:904-906 (2000).

(Continued)

*Primary Examiner* — Camie Thompson
(74) *Attorney, Agent, or Firm* — Marshall, Gerstein & Borun LLP

(57) ABSTRACT

Light emitting devices are described which incorporate, as the light emitting element, a dendrimer of which the constituent dendrons include a conjugated dendritic structure comprising aryl and/or heteroaryl groups connected to each other via bonds between $sp^2$ hybridised ring atoms of said aryl or heteroaryl groups.

20 Claims, 12 Drawing Sheets

U.S. PATENT DOCUMENTS

| | | | |
|---|---|---|---|
| 7,537,842 B2 | 5/2009 | Burn et al. | |
| 7,592,074 B2 | 9/2009 | Burn et al. | |
| 7,632,576 B2 | 12/2009 | Burn et al. | |
| 7,906,902 B2* | 3/2011 | Burn et al. | 313/504 |
| 7,960,557 B2 | 6/2011 | Burn et al. | |
| 7,960,725 B2* | 6/2011 | Burn et al. | 257/40 |
| 2003/0165716 A1 | 9/2003 | Samuel et al. | |
| 2004/0137263 A1 | 7/2004 | Burn et al. | |
| 2004/0169463 A1 | 9/2004 | Burn et al. | |
| 2005/0116622 A1 | 6/2005 | Lo et al. | |
| 2005/0164029 A1 | 7/2005 | Burn et al. | |
| 2011/0163270 A1 | 7/2011 | Burn et al. | |

FOREIGN PATENT DOCUMENTS

| | | |
|---|---|---|
| EP | 1 009 042 A2 | 6/2000 |
| EP | 1 009 043 A2 | 6/2000 |
| EP | 1 009 044 A2 | 6/2000 |
| JP | 1-105955 | 4/1989 |
| JP | 1-279240 | 11/1989 |
| JP | 08-012967 A | 1/1996 |
| JP | 09-241265 A | 9/1997 |
| WO | WO-99/21935 A1 | 5/1999 |
| WO | WO-01/23344 A1 | 4/2001 |
| WO | WO-01/59030 A1 | 8/2001 |

OTHER PUBLICATIONS

Armaroli et al., "A Copper(I) Bis-Phenanthroline Complex Buried in Fullerene-Functionalized Dendritic Black Boxes," *Angew. Chem. Int. Ed.* 38(24):3730-3733 (1999).

Adronov et al., "Light-Harvesting Dendrimers," *Chem. Commun.* 1701-1710 (2000).

Baldo et al., "High-efficiency Fluorsecent Organic Light-emitting Devices using a Phosphorescent Sensitizer," *Nature*, 403:750-753 (2000).

Balzani et al., "Bottom-Up Strategy to Obtain Luminescent and Redox-Activie Metal Complexes of Nanometric Dimensions," *Coord. Chem. Rev.*, 132:1-13 (1994).

Balzani et al., "Harvesting Sunlight by Artificial Supramolecular Antennae,"*Solar Energy Materials and Solar Cells*, 38:159-173 (1995).

Beaupré et al., "Synthesis and Characterization of a Novel Polyester Derived from Substituted Terfluorene," *Macromol. Rapid Commun.*, 21,:1013-1018 (2000).

Bettenhausen et al., "Dendrimers With 1,3,4-Oxadiazole Units, 1," *Macromol. Rapid Commun.* 17:623-631 ) 1996).

Bhyrappa et al., "Dendrimer-Metalloporphyrins: Synthesis and Catalysis," *J. Am. Chem. Soc.*, 118: 5708-5711 (1996).

Burn et al., "Chemical Tuning of the Electronic Properties of Poly(p-phenylenevinylene)-Based Copolymers," *J. Am. Chem. Soc.*, 115:10117-10124 (1993).

Chan et al., "Light-Emitting Multifunctional Rhenium (I) and Ruthenium (II) 2,2'-bipyridyl Complexes with Bipolar Character," *Applied Physics Letters*, 75(25):3920-3922 (1999).

Chen et al., "Recent Developments in Molecular Organic Electroluminescent Materials," *Macromolecular Symposia*, 125:1-48 1998.

Deb et al., "A Simple Orthogonal Approach to Poly(Phenylenevinylene) Dendrimers," *J. Am. Chem. Soc.*, 119:9079-9080 (1997).

Devadoss et al., "Energy Transfer in Dendritic Macromolecules: Molecular Size Effects and the Role of an Energy Gradient," *J. Am. Chem. Soc.*, 118:9635-9644 (1996).

Djurovich et al., "Ir(III) Cyclometalated Complexes as Efficient Phosphorescent Emiiters in Polymer Blend and Organic LEDs," *Polymer Reprints*, 41:770-771 (2000).

Examination Report for Application No. 02700448.0-1235, dated Aug. 30, 2009.

Examination Report for Application No. 0200448.0-1235, dated Nov. 20, 2007.

Fischer et al., "Dendrimers: From Design to Application—A Progress Report," *Angew. Chem. Int. Ed.* 38,:884-905 (1999).

Freeman et al., "Dendrimer-Containing Light-Emitting Diodes: Toward Site-Isolation of Chromophores," *J. Am. Chem. Soc.*, 122:12385-12386 (2000).

Gong et al., "Trifunctional Light-Emitting Molecules Based on Rhenium and Ruthenium Bipyridine Complexes," *Adv. Mater.*, 10(16):1337-1340 (1998).

Gorman, "Metallodendrimers: Structural Diversity and Functional Behavior," *Adv. Mater.*, 10(4):295-309 (1998).

Gutierrez et al., "Cyclometallation Palladium 2-Arylpyridine Complexes," *J. Organomet. Chem.*, 202:341-350 (1980).

Halim et al., "Conjugated Dendrimers for Light-Emitting Diodes: Effect of Generation", *Adv. Mater.* 11(5):371-374 (1999).

Huang et al., "Design and Synthesis of Electroluminescent Europium Complexes Containing Dendron Substituted Diketone Ligands," *Physical Organic, Photochemistry, Materials, Heterocycles, Aromatics, and Metal-Mediated Reactions Symposium* (2000).

Issberner et al., "Dendrimers: From Generations and Functional Groups to Functions," *Angew. Chem. Int. Ed. Engl.*, 33(23/24):2413-2420 (1994).

International Search Report in PCT/GB02/00739 dated Jun. 4, 2002.

International Preliminary Examination Report in PCT/GB02/00739 dated Dec. 18, 2002.

Jandke et al., "Phenylquinoxaline Polymers and Low Molar Mass Glasses as Electron-Transport Materials in Organic Light-Emitting Diodes," *Macromolecules*, 31:6434-6443 (1998).

Kawa et al., "Enhanced Luminescence of Lanthanide within Lanthanide-Cored Dendrimer Complexes," *Thin Solid Films*, 331(1-2):259-263 (1998).

Kimura et al., "Energy Transfer Within Ruthenium-Cored Rigid Metallodendrimers," *Elsevier Science Ltd., Tetrahedron Letters*,41: 6809-6813 (2000).

Kraft, "Self-Association of a 1,3,4-Oxadiazole-Containing Dendrimer," *Chem. Commun.*, 77-79 (1996).

Li et al., "Design, Synthesis, and Photodynamics of Light-Harvesting Arrays Comprised of a Porphyrin and One, Two, or Eight Boron-Dipyrrin Accessory Pigments," *J. Am. Chem. Soc.*, 120:10001-10017 (1998).

Kwok et al., "Synthesis and Light-Emitting Properties of Difunctional Dendritic Distyrylstilbenes," *Macromolecules*, 34(19):6821-6830 (2001).

Lupton et al., "Control of Electrophosphorescence in Conjugated Dendrimer Light-Emitting Diodes," *Adv. Funct. Mater.*, 11(4):287-294 (August 2001).

Miller et al., "Synthesis and Characterization of a Series of Monodisperse, 1,3,5-Phenylene-Based Hydrocarbon Dendrimers Including $C_{276}H_{186}$ and Their Fluorinated Analogues," *J. Am. Chem. Soc.*, 114:1018-1025 (1992).

Murfee et al., "New Metallodendrimers Containing an Octakis(diphenylphosphino)-Functionalized Silsesquioxane Core and Ruthenium(II)-Based Chromophores," *Inorg. Chem.*, 39:5209-5217 (2000).

Murfee et al., "New Starburst Metallodendrimers Based on Octa(Diphenylphosphino)-Functionalized Silsesquioxane Cores," *Am. Chem. Soc. Div. Polym. Chem.*, 41(1):431-432 (2000).

Newkome et al., "Nanometric Dendritic Macromolecules: Stepwise Assembly by Double (2,2':6,2"-terpyridine)ruthenium(I) Connectivity," *J. Mater. Chem.*, 7(7):1237-1244 (1997).

Nunez et al., "Dendritic Macromolecules for Light-Energy Conservation," *Book of Abstracts, 215th ACS National Meeting*, Dallas, Mar. 29-Apr. 2, 1998.

Ranger et al., "New Well-Defined Poly(2,7-fluorene) Derivatives: Photoluminescence and Base Doping", *Macromolecules*, 30,:7686-7691 (1997).

Palmans et al., "Tensile Orientation Behavior of Alkoxy-Substituted Bis(phenylethynyl)benzene Derivatives in Polyolefin Blend Films," *Chem. Mater.*, 12:472-480 (2000).

Phelan et al., "Synthesis of Luminescent Materials Containing Rare Earth Cored Dendritic ?-diketones," *Sci-Mix Symposium* (2001).

Pillow et al., "Synthetic Routes to Phenylene Vinylene Dendrimers," *Synthetic Metals* 102:1468-1469 (1999).

Plevoets et al., "Supramolecular Dendrimers with a [Ru(bpy)3]2+ Core and Naphthy Peripheral Units," *New J. Chem.*, 23(1):63-69 (1999).

Search Report in GB 0104177.1 dated Aug. 29, 2001.

Sakamoto et al., "Synthesis, Characterization, and Electron-Transport Property of Perfluorinated Phenylene Dendrimers," *J. Am. Chem. Soc.*, 122:1832-1833 (2000).

Serroni et al., "Polynuclear Metal Complexes of Nanometre Size. A Versatile Synthetic Strategy Leading to Luminescent and Redox-Active Dendrimers Made of an Osmium(II)-Based Core and Ruthenium(II)-Based Units in the Branches," *J. Mater. Chem.*, 7(7):1227-1236 (1997).

Setayesh et al., "Polyfluorenes with Polyphenylene Dendron Side Chains: Toward Non-Aggregating, Light-Emitting Polymers", *Journal of the American Chemical Society*, 123:946-953 (2001).

Suslick et al., "Regioselective Epoxidations of Dienes with Manganese(III) Porphyrin Catalysts," *J. Chem. Soc., Chem. Commun.*, 200-202 (1987).

van der Sluis et al., "Synthesis of Novel Phosphaalkene-Based Bidentate Ligands Mes*P=CH(3-R-Ar) (R=Pyridyl, Carbaldimino) and Formation of Three-Membered Palladacycles . . . by Carbapalladation of the P=C Double Bond," *Organometallics*, 18:1402-1407 (1999).

Venturi et al., "Electrochemical and Photochemical Properties of Metal-Containing Dendrimers," *Topics in Current Chemistry*, 197:193-228 (1998).

Vogtle et al., "Dendrimers with a Photoactive and Redox-Active [Ru(bpy)3]2+-Type Core: Photophysical Properties, Electrochemical Behavior, and Excited-State Electron-Transfer Reactions," *J.Am. Chem. Soc.*, 121:6290-6298 (1999).

Volz et al., "meso-Substituierte Porphyrine, 5[1] Korbporphyrine," *Institut für Organische Chemie der Universität Karlsruhe, Z. Naturforsch.*, 43b:1043-1052 (1998).

Wang et al., "Electroluminescent Diodes from a Single-Component Emitting Layer of Dendritic Macromolecules," *Advanced Materials*, 8::193-241 (Mar. 1996).

Wiesler et al., "Divergent Synthesis of Polyphenylene Dendrimers: The Role of Core and Branching Reagents Upon Size and Shape," *Macromolecules*, 34: 187-199 (2001).

Yang et al., "Use of Poly(9-vinylcarbazole) as Host Material for Iridium Complexes in High-efficiency Organic Light-emitting Devices," *Jpn. J. Appl. Phys.*, 30:L828-L829 (2000).

\* cited by examiner

ARYL-ARYL DENDRIMERS

This is a continuation of U.S. patent application Ser. No. 12/626,605 filed Nov. 25, 2009 (now U.S. Pat. No. 7,960, 725), which is a continuation of U.S. patent application Ser. No. 10/468,681 filed Jan. 20, 2004 (now U.S. Pat. No. 7,632, 576), which is the U.S. national phase of International Application No. PCT/GB02/00739 filed Feb. 20, 2002, the entire disclosures of which are hereby incorporated herein by reference.

This invention relates to dendrimers and light emitting devices containing them.

Light-emitting materials fall into three classes, namely molecular, polymeric, and dendritic. Dendritic materials have several advantages over molecular and polymeric materials including: a) the electronic properties can be changed without altering the processing properties; b) a greater variety of chromophores can be used as the dendritic architecture can stop $\pi$-$\pi$ stacking of the chromophores; c) the efficiency of light-emitting diodes can be controlled by the dendrimer generation i.e. the number of sets of branching points within a dendron; and d) the dendrimer architecture makes the formation of blends with other dendrimers, polymers and molecular materials simple. Dendrimers consist of dendrons or dendritic structures terminating in surface groups and a core (see FIG. 1). Dendrons also known as dendrites have at least one, and preferably more than one, branching point. The branching points are atoms or groups to which at least two branches or linkers are attached. The nature of the branching points and the links between the branching points can be varied. A branching group is generally connected to the next branching group optionally via one or more linking groups (eg aryl-aryl'-aryl) where aryl is a branching group and aryl' a linking group. There are at least three attachments in total to a branching group, but only two are necessary to a linker group.

There have been a number of classes of light-emitting dendrimers reported with the main differences observed in the dendron architecture. The first report of a light-emitting dendrimer had a fluorescent core and phenylacetylene based dendrons. More recently a superior system has been reported where the dendrimers are again comprised of a fluorescent core but the dendrons contain stilbene moieties. Dendrimers based on this latter architecture have been shown to have the advantages described above over molecular and polymeric materials. Some simple dendrimers that contain biphenyl based dendrons have also been described. Finally, there have been a few reports of dendrimers that contain luminescent chromophores but where the dendrons contain non-conjugated branching points. These latter materials have the potential disadvantage that much of it is comprised of electrically insulating groups. The dendrimer types that are likely to have the greatest promise are those that contain mostly conjugated dendrons. These include those described in WO99/21935. However, aryl-vinyl-aryl dendrons may not be optimal for electroluminescent devices. For example, in polyaryleneviyinlene based light emitting devices, the vinyl groups have been implicated as degradation sites. By analogy the vinyl groups in aryl-vinyl-aryl dendrons may be potential degradation sites. It may therefore be desirable to avoid vinyl groups. Also the control of colour and charge transport in dendrimers is governed by the interactions between dendrimers and is changed by altering the shape and generation of the dendrimer. Aryl-aryl'-aryl dendrons will be a different shape to aryl-vinyl-aryl dendrons.

According to the present invention there is provided a light emitting device (i.e. visible light) containing a dendrimer in which the dendritic structures comprise branching, and optionally linking, (hetero) aryl groups wherein each aryl group is directly attached to another (hetero) aryl group. Thus the dendritic structure is aryl-aryl or aryl-(aryl')$_a$-aryl (where aryl' may be different from aryl and a is integer from 0 to 4).

Thus in the at least inherently partially conjugated dendrimers of this invention the core terminates at the single bond to the first branching group, i.e. a bond to the sp$^2$ hybridised ring atom of a (hetero)aryl branching group, the ring atom forming part of the dendron. Typically the ring atom will be carbon.

The present invention provides, in particular, a light-emitting device incorporating as its light emitting element a compound having the formula (I):

$$\text{CORE-[DENDRITE(-Q)}_a]_n \quad \text{(I)}$$

in which the CORE represents an atom or group, n represents an integer of at least 1, Q is a proton or a surface group, a is an integer and DENDRITE, which may be the same or different if n is greater than 1, represents a conjugated dendritic structure comprising aryl and/or heteroaryl groups connected to each other via bonds between sp$^2$ hybridised ring atoms of said aryl or heteroaryl groups, CORE terminating in the first single bond which is connected to an sp$^2$ hybridised ring atom of an (hetero)aryl group to which more than one conjugated dendritic branch is attached, said atom forming part of the DENDRITE, the CORE and/or DENDRITE being luminescent; provided that the compound is not:

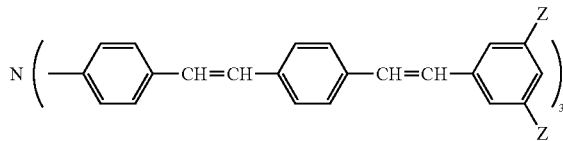

wherein each Z is a group of formula:

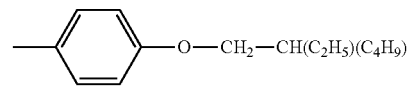

In another aspect the invention provides a light emitting device incorporating as its light emitting element a compound having the formula (II):

$$\text{CORE-[DENTRITE(-Q)}_a]_n \quad \text{(II)}$$

in which the CORE represents an atom or group other than a nitrogen atom or a group of tetrahedral shape, n represents an integer of at least 1, Q is a proton or a surface group, a is an integer and DENDRITE, which may be the same or different if n is greater than 1, represents a conjugated dendritic structure comprising aryl and/or heteroaryl groups connected to each other via bonds between sp$^2$ hybridised ring atoms of said aryl or heteroaryl groups, CORE terminating in the first single bond which is connection to an sp$^2$ hybridised ring atom of an (hetero) aryl group to which more than one conjugated dendritic branch is attached, said atom forming part of the DENDRITE, the CORE and/or DENDRITE being luminescent.

In each structural unit [DENDRITE(-Q)$_a$] of formula (I) or (II) as defined above, a is 0 or an integer which equals the number of bonding atoms of the distal end groups of DENDRITE which are not attached to a branch point. The parameter a increases with increasing generation. For example, in a DENDRITE which consists of two distal phenyl rings, a is 10.

In a higher generation, where the DENDRITE consists of 4 distal phenyl rings, a is 20. In a preferred embodiment at least one bonding atom on each distal group is attached to a Q which is not a proton.

In this context, conjugated dendrons (dendrites) indicate that they are made up of alternating double and single bonds, apart from the surface groups. However, this does not mean that the π system is fully delocalised. The delocalisation of the π system is dependent on the regiochemistry of the attachments.

Thus the dendrimers contain at least one aryl-aryl or, more generally, aryl-(aryl')$_a$-aryl group, wherein aryl includes heteroaryl and aryl' is the same as or different from aryl and a is an integer from 0 to 4. It is to be understood that references to aryl (and aryl') include heteroaryl and fused aromatic ring systems.

It is also to be understood that not all the aryl groups are necessarily branching groups e.g. as in

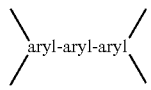

where the central group is a linking group.

In one embodiment the structure is not

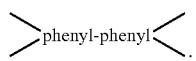

Thus it is preferred that when phenyl is the branching group then the structure of the dendron contains

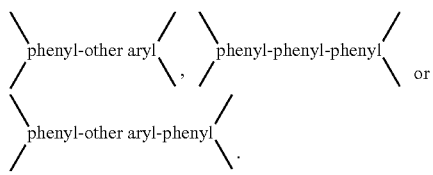

In addition, one dendron can contain more than one type of link between the branch points or different branch points. For example, a single dendron may contain a mixture of phenyl-phenyl branches and, say, phenyl-pyridyl branches.

The dendrimer may have more than one luminescent moiety and the energy resulting from electrical or optical excitation may be transferred to one of them for light emission. In a preferred embodiment the dendrimer incorporates at least two inherently at-least-partly-conjugated luminescent moieties which moieties may or may not be conjugated with each other, wherein the dendron includes at least one of the said luminescent moieties. Preferably the luminescent moiety or moieties further from the core of the dendrimer have a larger HOMO-LUMO energy gap than the luminescent moiety or moieties closer to or partly or wholly within the core of the dendrimer. In another embodiment the HOMO-LUMO energy gap is substantially the same although the surface groups may change the HOMO-LUMO energy gap of the chromophores at the surface of the dendrimer. Sometimes in, say, the second generation dendrimer the surface group makes the chromophore at the distal end of the dendrite of lower HOMO-LUMO energy compared to that of the next one in.

The relative HOMO-LUMO energy gaps of the moieties can be measured by methods known per se using a UV-visible spectrophotometer. The graduation of HOMO-LUMO energy gap being lower in those luminescent moieties which are closer to the core may be generally beneficial in encouraging inwards charge transfer and increased light-emitting activity within the dendrimer molecules. One of the luminescent moieties may be, or (partly or wholly) within, the core itself, which will thus preferably have a smaller inherent HOMO-LUMO energy gap than the other luminescent moiety or moieties in the dendron. Alternatively, or in addition, the dendrons themselves may each contain more than one luminescent moiety, in which case those further from the core will again preferably have larger inherent HOMO-LUMO energy gap than those closer to the core. In this case, the core itself need not be luminescent, although luminescent cores are generally preferred.

Suitable surface groups for the dendrimers include branched and unbranched alkyl, especially t-butyl, branched and unbranched alkoxy, such as 2-ethylhexyloxy or n-butyloxy, hydroxy, alkylsilane, carboxy, carbalkoxy, and vinyl. A more comprehensive list include a further-reactable alkene, (meth)acrylate, sulphur-containing, or silicon-containing group; sulphonyl group; polyether group; $C_1$ to $C_{15}$ alkyl (preferably t-butyl) group; amine group; mono-, di- or tri-$C_1$ to $C_{15}$ alkyl amine group; —COOR group wherein R is hydrogen or $C_1$ to $C_{15}$ alkyl; —OR group wherein R is hydrogen, aryl, or $C_1$ to $C_{15}$ alkyl or alkenyl; —O$_2$SR group wherein R is $C_1$ to $C_{15}$ alkyl or alkenyl; —SR group wherein R is aryl, or $C_1$ to $C_{15}$ alkyl or alkenyl; —SiR$_3$ group wherein the R groups are the same or different and are hydrogen, $C_1$ to $C_{15}$ alkyl or alkenyl, or —SR' group (R' is aryl or $C_1$ to $C_{15}$ alkyl or alkenyl), aryl, or heteroaryl. Typically t-butyl and alkoxy groups are used. Different surface groups may be present on different dendrons.

It is preferred that the dendrimer is solution-processable i.e. the surface groups are such that the dendrimer can be dissolved in a solvent. In one embodiment the surface group is such that, on processing, the dendrimer can be photopatterned. For example a cross-linkable group is present which can be cross-linked upon irradiation or by chemical reaction. Alternatively the surface group comprises a protecting group which can be removed to leave a group which can be cross-linked. In general, the surface groups are selected so the dendrimers are soluble in solvents suitable for solution processing.

The aryl (and aryl') groups within the dendrons can be typically benzene, napthalene, anthracene, fluorene, pyridine, oxadiazole, triazole, triazine, thiophene and where appropriate substituted variations. These groups may optionally be substituted, typically by $C_1$ to $C_{15}$ alkyl or alkoxy groups. The aryl groups at the branching points are preferably benzene rings, preferably coupled at ring positions 1, 3 and 5, pyridyl or triazinyl rings. The dendrons themselves can contain a, or the, fluorescent chromophore.

The cores can be comprised of luminescent or non-luminescent moieties. In the latter case the dendrons must contain fluorescent groups. In the case of the cores being luminescent they can be comprised of either organic and/or organometallic fluorophores and/or phosphors. Typical cores include one or more moieties of benzene, pyridine, pyrimidine, triazine, thiophene, fluorene, typically 9,9-dialkyl substituted fluorene eg. 9,9-dihexylfluorene, divinylbenzene, distyrylethylene, divinylpyridine, pyrimidine, triazine, divinylthiophene, oxadiazole, coronene, or a fluorescent dye or marker compound or a metallic chromophore such as a lanthanide, or iridium complex, or a metalloporphyrin. These various rings may be substituted, for example by $C_1$ to $C_{15}$ alkyl or alkoxy groups.

It is possible to control the electron affinity of the dendrimers by the addition to the chromophores of electron-withdrawing groups, for example cyano and sulfone which are strongly electron-withdrawing and optically transparent in the spectral region we are interested in. Further details of this and other modifications of the dendrimers can be found in WO99/21935 to which reference should be made.

The dendrimers for the present invention can be prepared in a similar manner to those described in WO99/21935. In a preferred embodiment, the dendrons are first prepared. The dendrons are then reacted with a functionality to form the core. For example a dendron is prepared with an aldehyde at the foci which can then be condensed with pyrrole to form a porphyrin cored dendrimer.

The dendrimer can be incorporated into a light emitting diode (LED), also known as an electroluminescent (EL) device, in a conventional manner. In a preferred embodiment the dendrimer acts as the light emitting element. By suitable selection of dendrons and surface groups the dendrimers can be made soluble in conventional solvents such as toluene, THF, water and alcoholic solvents such as methanol. In its simplest form, an organic light emitting or electroluminescent device can be formed from a light emitting layer sandwiched between two electrodes, at least one of which must be transparent to the emitted light. Such a device can have a conventional arrangement comprising a transparent substrate layer, a transparent electrode layer, a light emitting layer and a back electrode. For this purpose the standard materials can be used. Thus, typically, the transparent substrate layer is typically made of glass although other transparent materials such as PET can also be used.

The anode which is generally transparent is preferably made from indium tin oxide (ITO) although other similar materials including indium oxide/tin oxide, tin oxide/antimony, zinc oxide/aluminum, gold and platinum can also be used. Conducting polymers such as PANI (polyaniline) or PEDOT can also be used.

The cathode is normally made of a low work function metal or alloy such as Al, Cu, Mg, Li, or MgAl or optionally with an additional layer of LiF. As is well known, other layers may also be present, including a hole transporting material and/or an electron transporting material. In an alternative configuration, the substrate may be an opaque material such as silicon and the light is emitted through the opposing electrode.

The dendrimers of the present invention can be deposited by known solution processing methods, such as spin-coating, printing, dip-coating. The dendrimer can be deposited as anent film or as a blend with other organic materials (dendrimers, polymers and/or molecular compounds). Other organic layers, for example charge transporting materials, can be deposited on top of the dendrimer film by evaporation, or by solution processing from a solvent in which the first layer is not soluble. The film thickness is typically 10 nm to 1000 nm, preferably less than 200 nm, more preferably less than 120 nm.

The dendrimers can also be used in other semiconducting devices which including photodiodes, solar cells, FET or a solid state triode.

The present invention will be further illustrated in the following Examples with reference to the accompanying Figures, in which.

EXAMPLE 1

G0-Br (1)

4-(2'-Ethylhexyloxy)phenylbromide

Figure 1:
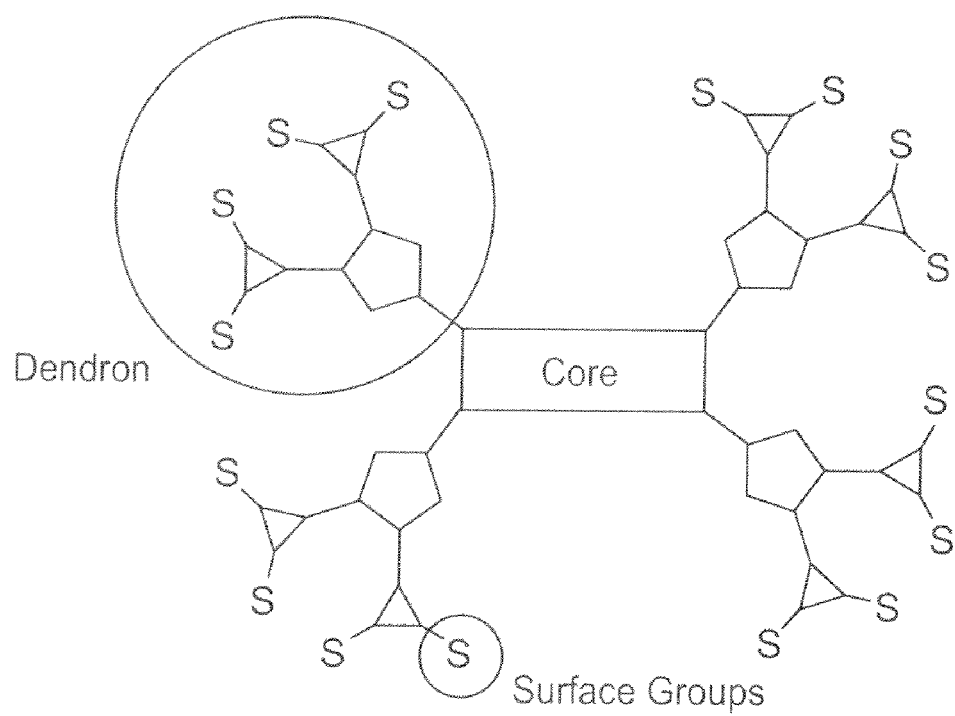
FIG. 1 shows a schematic diagram of a dendrimer.
Figure 2:
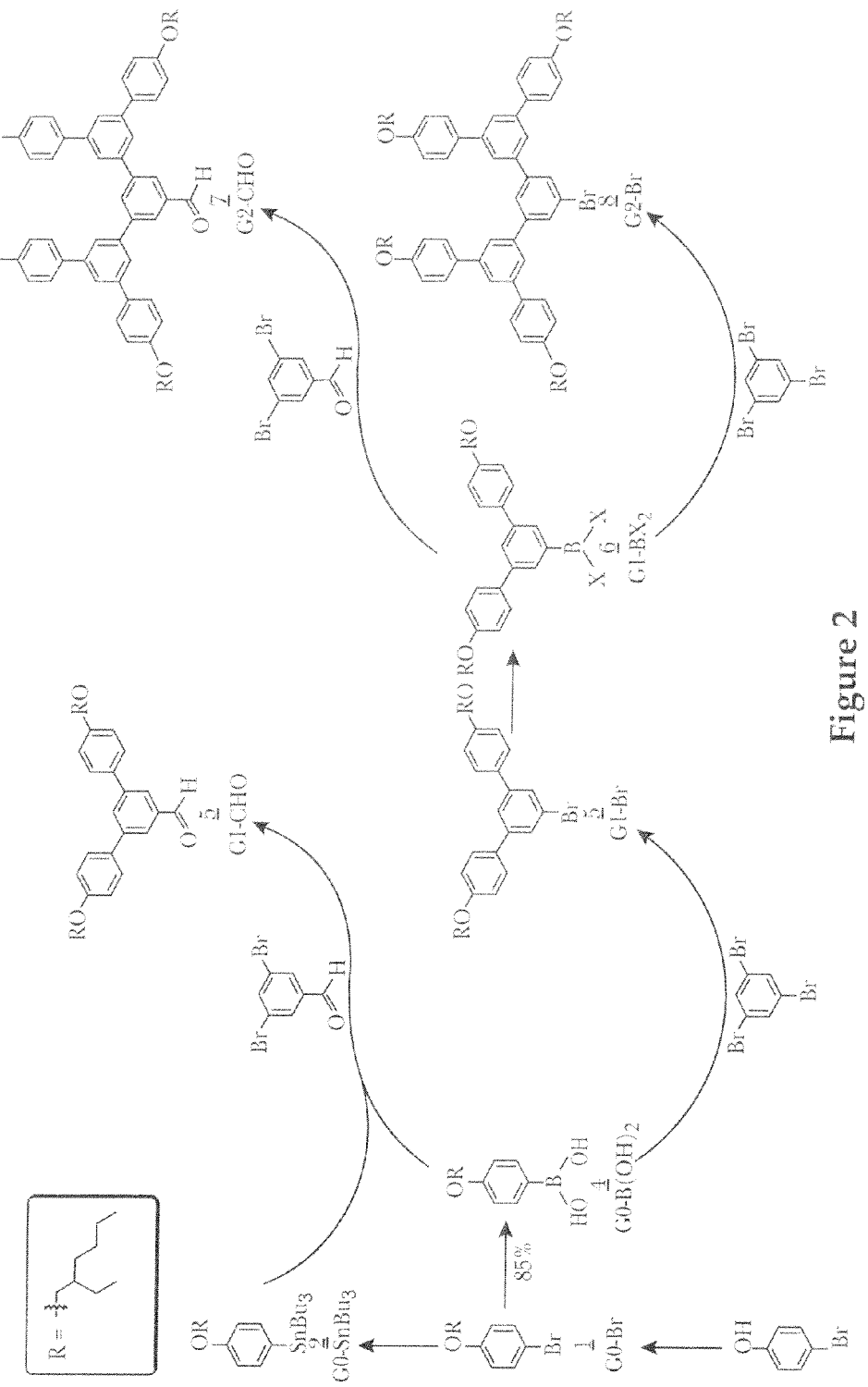
FIG. 2 shows the reaction scheme for the preparation of higher generation dendritic intermediates.
Figure 3:
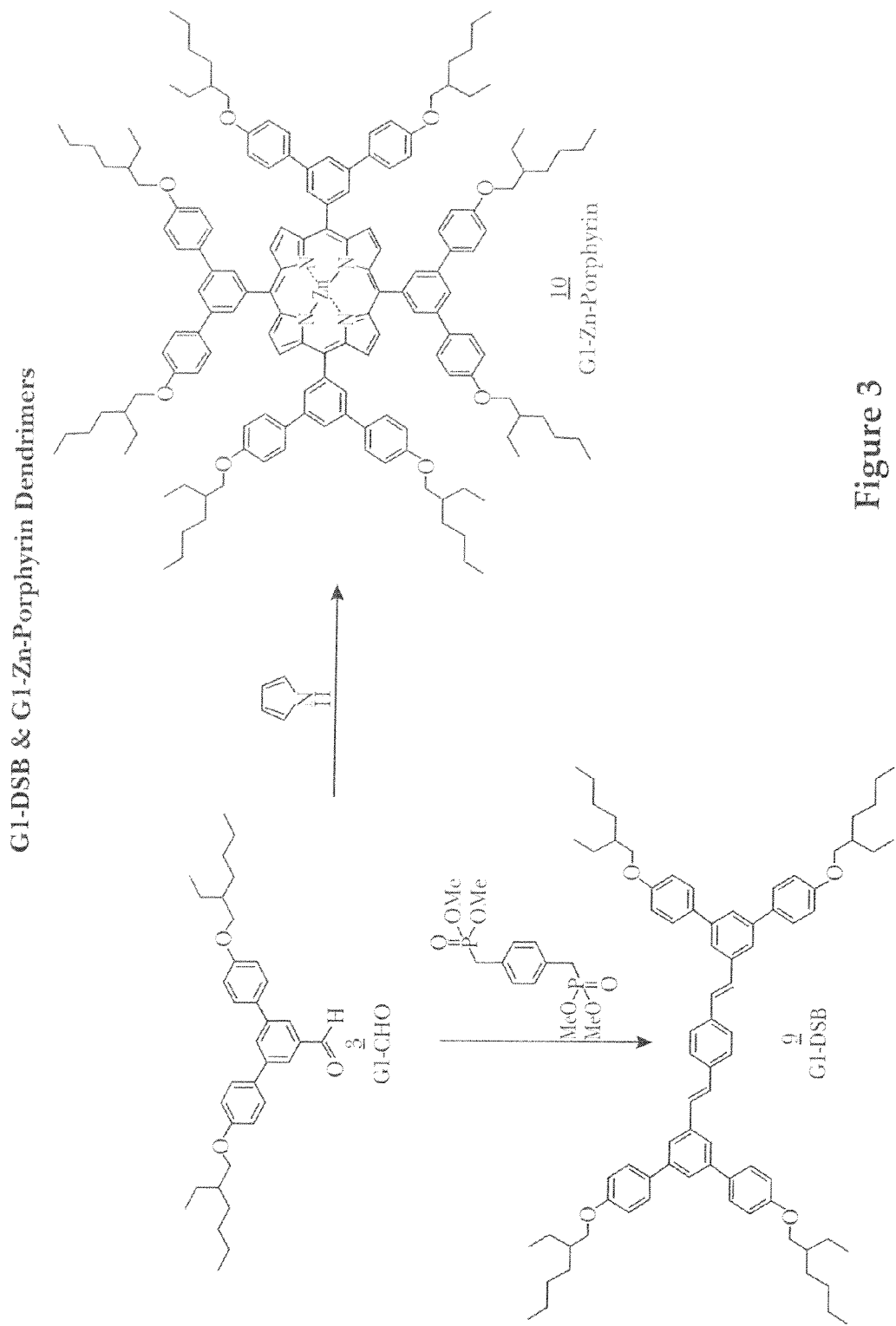
FIG. 3 shows two first generation dendrimers.
Figure 4:
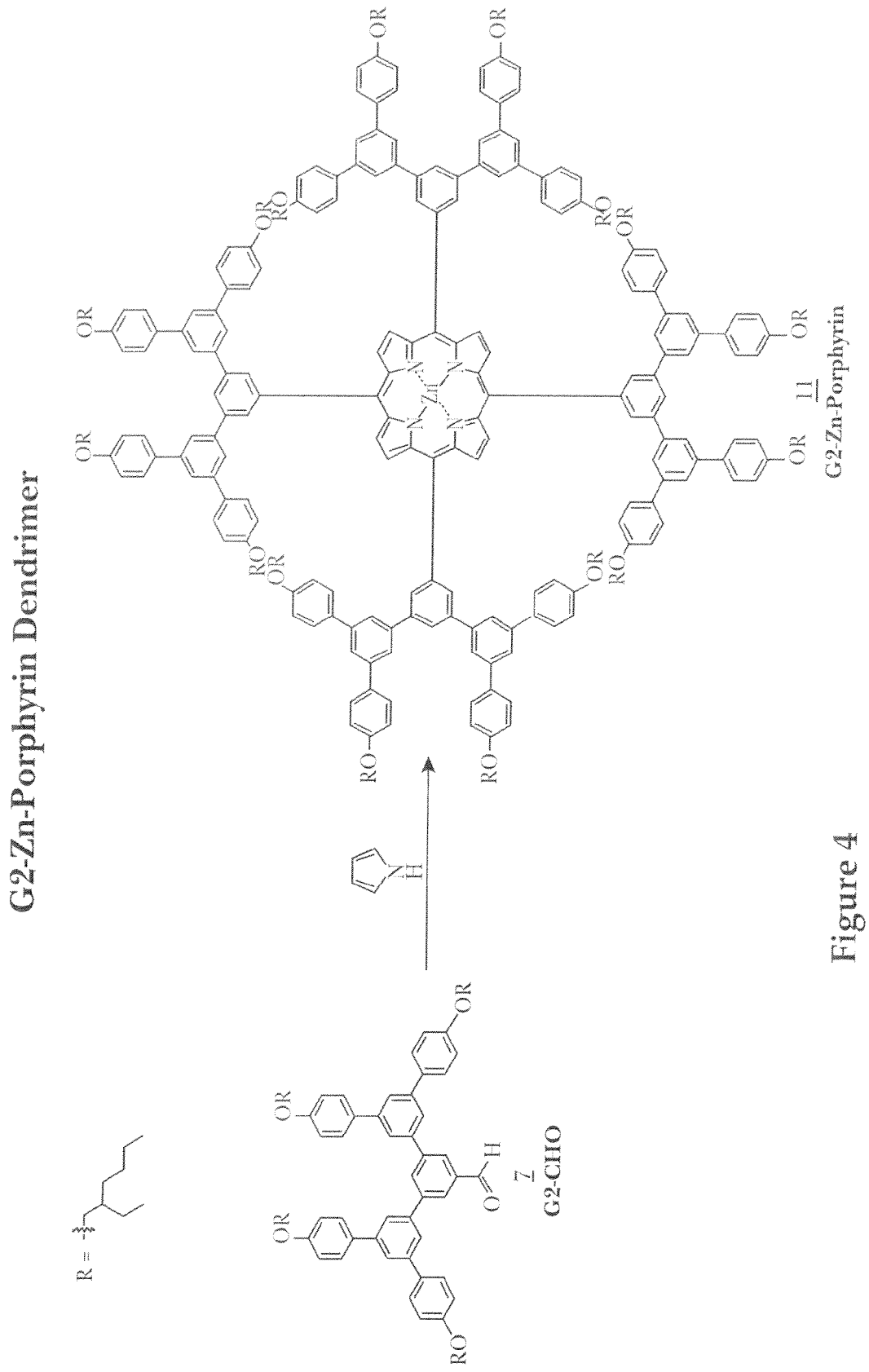
FIG. 4 shows a second generation Zn-porphyrin cored dendrimer.

Sodium hydride (60% dispersion in oil, 17.4 g, 435 mmol) was added in portions to a cold (ice-bath) solution of 4-bromophenol (49.0 g, 283 mmol) in dry DMF (780 $cm^3$). The mixture was stirred at that temperature for 2 h and the ice bath was removed. A solution of 2-ethylhexylbromide (54.4 $cm^3$, 306 mmol) in 150 $cm^3$ of dry DMF was added dropwise through an addition funnel to the reaction mixture and the reaction was stirred at room temperature overnight (21 h). The resultant mixture was diluted with water (400 $cm^3$) and ether (500 $cm^3$). The two phases were separated. The aqueous layer was extracted with ether (3×300 $cm^3$) and the organic portion and the ether extracts were dried over anhydrous $MgSO_4$, filtered and the filtrate was collected and evaporated under reduced pressure to leave yellow oil. Column chromatography over silica gel (half amount each time) with light petroleum as eluent afforded 1 (54.1 g, 67%) as colourless oil; $\lambda_{max}(CH_2Cl_2)$/nm 284 ($\epsilon$/$dm^3$ $mol^{-1}$ $cm_{-1}$1251), and 291 sh (1001); $\delta_H$(400 MHz; $CDCl_3$) 0.83-0.97 (6H, m, Me), 1.30-1.57 (8H, m, $CH_2$), 1.68-1.79 (1H, CH), 3.78-3.84 (2H, m, $ArOCH_2$), 6.74-6.80 (2H, m, ArH), and 7.33-7.40 (2H, m, ArH); $\delta_C$(100 MHz; $CDCl_3$) 11.1, 14.1, 23.0, 23.8, 29.1, 30.4, 39.3, 70.7, 112.4, 116.3, 132.1, and 158.5.

EXAMPLE 2

G0-$SnBu_3$ (2)

1-(2'-Ethylhexyloxy)-4-(tri-n-butyl)stannylbenzene

Teri-butyl lithium (1.7 M, 21.7 $cm^3$, 36.8 mmol) was added slowly over 10 min to a cold (dry-ice/acetone bath) solution of G0-Br 1 (7.00 g, 24.5 mmol) in 54 $cm^3$ of ether under argon atmosphere. The mixture was stirred at −78° C. for 2 h and tri-n-butyl tin chloride (10 $cm^3$, 36.8 mmol) was added dropwise over 5 min to the mixture, which was stirred at −78° C. for 1 h before being removed from the dry-ice/acetone bath. The mixture was stirred at room temperature for a further 3 h before being quenched with 10% of $NH_4Cl_{(aq)}$ (20 $cm^3$). The aqueous layer was separated and extracted with dichloromethane (DCM) (2×10 $cm^3$). The DCM extracts and the ether portion were then dried ($MgSO_4$) and filtered. The solvents were removed completely. Kugolrohr distillation removed the excess tri-n-butyl tin chloride to leave 12.0 g (99%) of 2 as a light yellow oil; $\lambda_{max}(CH_2Cl_2)$/nm 277 ($\epsilon$/$dm^3$ $mol^{-1}$ $cm^{-1}$ 826), and 284sh (660); $\delta_H$(200 MHz; $CDCl_3$) 0.81-1.09 (15H, m, Me), 1.21-1.81 (27H, m, $CH_2$ & CH), 3.84 (2H, $ArOCH_2$), 6.91 (2H, m, ArH), and 7.36 (2H, m, ArH).

EXAMPLE 3

G1-CHO (3)

3,5-Di[4'-(2''-ethylhexyloxy)phenyl]benzaldehyde

Method 1:

A mixture of 2 (8.50 g, 17.2 mmol), 3,5-di-bromobenzaldehyde (1.18 g, 4.47 mmol), CuI (790 mg, 4.15 mmol), tetrakis(triphenylphosphine) palladium (0) (790 mg, 0.684 mmol) and 20 $cm^3$ of distilled triethylamine was heated at reflux for 14 h under argon. The reaction mixture was allowed to cool and then filtered through a plug of silica gel using DCM as eluent. The filtrate was collected and the solvent was completely removed to yield a brown yellow oil. The residue was purified by column chromatography over silica using ethyl acetate-light petroleum (0:1 to 1:10) as eluent to give 3 as a colourless oil (1.91 g, 83%); $v_{max}$/cm$^{-1}$ (neat) 1700 (C=O); $\lambda_{max}$(CH$_2$Cl$_2$)/nm 247 ($\epsilon$/dm$^3$ mol$^{-1}$ cm$^{-1}$ 22406), 274 (27554), and 339sh (1817); $\delta_H$(400 MHz; CDCl$_3$) 0.88-1.01 (12H, m, Me), 1.30-1.61 (16H, m, CH$_2$), 1.73-1.84 (2H, m, CH), 3.94 (4H, m, ArOCH$_2$), 7.04 (4H, m, ArH), 7.62 (4H, m, ArH), 7.99 (3H, s, ArH), and 10.13 (1H, s, CHO); $\delta_C$(100 MHz; CDCl$_3$) 11.1, 14.1, 23.1, 23.9, 29.1, 30.5, 39.4, 70.6, 115.0, 126.0, 128.2, 130.8, 131.9, 137.4, 142.3, 159.6, and 192.5; m/z [CI(NH$_3$)] 533 (MNH$_4^+$), and 515 (M$^+$).

Method 2:

A mixture of 4B (213 mg, 0.851 mmol), 3,5-di-bromobenzaldehyde (98 mg, 0.370 mmol), tetrakis(triphenylphosphine) palladium (0) (30 mg, 0.026 mmol), 2 M Na$_2$CO$_{3(aq)}$ (0.5 cm$^3$), EtOH (0.5 cm$^3$) and toluene (1.1 cm$^3$) was degassed and heated at reflux (with bath temperature of 96° C.) under argon for 18 h. The mixture was allowed to cool. Water (4 cm$^3$) and ether (5 cm$^3$) were added to the mixture. The two phases were separated. The aqueous layer was extracted with ether (3×5 cm$^3$). The organic layer and the ether extracts were combined and dried over anhydrous magnesium sulfate and filtered. The solvents were completely removed. The residue was purified by column chromatography over silica gel using light petroleum (60-80° C.) as eluent to give 172 mg (90%) of 3 as a colourless oil.

EXAMPLE 4

G0-B(X)$_2$ (4)

4-(2'-Ethylhexyloxy)phenylboronic acid

Tert-butyl lithium (1.7 M, 66.0 cm$^3$, 112 mmol) was added carefully to a cold (dry-ice/acetone bath) solution of G0-Br 1 (20.0 g, 70.1 mmol) in 300 cm$^3$ of anhydrous THF under an argon atmosphere. The mixture was stirred at −78° C. for 1 h and then tri-methyl borate (57.2 cm$^3$, 421 mmol) was added slowly to the cold mixture. The reaction was stirred at −78° C. for 2 h before being removed from the dry-ice/acetone bath. The mixture was then stirred at room temperature for further 2.5 h before being quenched with 3 M HCl$_{(aq)}$(30 cm$^3$). The two layers were separated. The aqueous layer was extracted with DCM (3×30 cm$^3$). The organic layer and the DCM extracts were combined and dried over anhydrous magnesium sulfate, filtered and the solvents were completely removed. Purification by column chromatography over silica gel using ethyl acetate-light petroleum (1:10), and then ethyl acetate-DCM (0:1 to 1:3) as eluent gave two major bands; less polar compound 4A, 6.44 g as a colourless oil; $\delta_H$(200 MHz; CDCl$_3$) 0.81-1.05 (6H, m, Me), 1.22-1.62 (8H, m, CH$_2$), 1.68-1.88 (1H, m, CH), 3.91 (2H, m, ArOCH$_2$), 6.98 (2H, m, ArH), and 7.77 (2H, m, ArH); and more polar compound, a trimer, 4B, 8.40 g as a colourless oil; $\delta_H$(200 MHz; CDCl$_3$) 0.85-1.07 (6H, m, Me), 1.30-1.64 (8H, m, CH$_2$), 1.70-1.90 (1H, m, CH), 3.95 (2H, m, ArOCH$_2$), 7.03 (2H, m, ArH), and 8.18 (2H, m, ArH).

Note: either compound 4A or 4B can be used in the reaction to form the next generation dendrons. In either case of 4A or 4B being a dimer the number of protons in the $^1$H NMR should be considered as a ratio.

EXAMPLE 5

G1-Br (5)

3,5-Di[4'-(2"-ethylhexyloxy)phenyl]phenyl bromide

A mixture of the boronic acid 4B (7.90 g, 31.6 mmol), 1,3,5-tribromobenzene (4.53 g, 14.4 mmol), tetrakis(triphenylphosphine) palladium (0) (1.16 g, 1.00 mmol), 2 M Na$_2$CO$_{3(aq)}$ (15 cm$^3$), EtOH (15 cm$^3$) and toluene (43 cm$^3$) was degassed and heated at reflux (with bath temperature of 101° C.) under argon for 22 h. The mixture was allowed to cool. Water (20 cm$^3$) and ether (30 cm$^3$) were added to the mixture. The two phases were separated. The aqueous layer was extracted with ether (3×20 cm$^3$). The organic layer and the ether extracts were combined and dried over anhydrous magnesium sulfate and filtered. The solvents were completely removed. The residue was purified by column chromatography over silica gel using light petroleum (60-80° C.) as eluent to give 6.04 g (74%) of 5 as a colourless oil; $\delta_H$(200 MHz; CDCl$_3$) 0.82-1.02 (12H, m, Me), 1.26-1.60 (16H, m, CH$_2$), 1.70-1.83 (2H, m, 2×CH), 3.90 (4H, m, ArOCH$_2$), 6.99 (4H, m, ArH), 7.54 (4H, m, ArH), and 7.62 (3H, s, ArH); m/z [MALDI] 566 (M$^+$). In addition, 910 mg (9%) of the tris-substituted compound as a colourless oil was isolated; $\delta_H$(200 MHz; CDCl$_3$) 0.82-1.02 (18H, m, Me), 1.25-1.63 (24H, m, CH$_2$), 1.70-1.83 (3H, m, CH), 3.90 (6H, m, ArOCH$_2$), 7.01 (6H, ArH), 7.62 (6H, m, ArH), and 7.65 (3H, s, ArH); m/z [APCI$^+$] 692 (MH$^+$).

EXAMPLE 6

G1-BX$_2$ (6)

Tert-butyl lithium (1.7 M, 3.0 cm$^3$, 5.15 mmol) was added to a cold (dry-ice/acetone bath) solution of aryl bromide 5 (1.82 g, 3.22 mmol) in 18 cm$^3$ of anhydrous THF under argon atmosphere. The reaction mixture, changing to a deep reddish brown was stirred at −78° C. for 1 h. Tri-n-butyl borate (5.2 cm$^3$, 19.3 mmol) was added slowly to the mixture and the reaction was stirred at −78° C. for 1 h before being removed from the dry-ice/acetone bath. The mixture was then stirred at room temperature for further 3.5 h before being quenched with 3 M HCl$_{(aq)}$(7 cm$^3$). The two layers were separated. The aqueous layer was extracted with DCM (3×5 cm$^3$). The organic layer and the DCM extracts were dried over anhydrous magnesium sulfate and filtered. The solvents were completely removed. Purification on silica gel column using ethyl acetate-light petroleum (1:10), and then ethyl acetate-DCM (1:4) as eluent gave 1.63 g (96%) of 6 as a colourless oil. The structure of 6 has not been fully determined however can be used to form higher generation dendrons in excellent yield.

EXAMPLE 7

G2-CHO (7)

3,5-Di{3',5'-di[4"-(2"'-ethylhexyloxy)phenyl] phenyl}benzaldehyde

A mixture of the G1-BX$_2$ 6 (6.30 g, 11.9 mmol), 3,5-dibromobenzaldehyde (1.04 g, 3.96 mmol), tetrakis(triphenylphosphine) palladium (0) (320 mg, 0.277 mmol), 2 M Na$_2$CO$_{3(aq)}$(11 cm$^3$), EtOH (11 cm$^3$) and toluene (26 cm$^3$) was degassed and heated at reflux (with bath temperature of 95° C.) under argon for 17 h. The resultant orange mixture was allowed to cool. Water (20 cm$^3$) and ether (20 cm$^3$) were added to the mixture. The two phases were separated. The aqueous layer was extracted with ether (3×30 cm$^3$). The organic layer and the ether extracts were dried over anhydrous magnesium sulfate and filtered. The solvents were completely removed. The residue was purified by column chromatography over silica gel using ethyl acetate-light petroleum (0:1 to 1:40) as eluent to afford 4.00 g (94%) of 7 as a colourless oil; $\delta_H$(200 MHz; CDCl$_3$) 0.83-1.05 (24H, m, Me), 1.25-1.60 (32H, m, CH$_2$), 1.65-1.89 (4H, m, CH), 3.91 (8H, m, ArOCH$_2$), 7.03 (8H, m, ArH), 7.65 (8H, m, ArH), 7.79 (6H, s, ArH), 8.22 (2H, s, ArH), 8.25 (1H, s, ArH), and 10.22 (1H, s, CHO).

EXAMPLE 8

G2-Br (8)

3,5-Di{3',5'-di[4"-(2'"-ethylhexyloxy)phenyl]phenyl}phenyl bromide

A mixture of the 6 (313 mg, 0.591 mmol), 1,3,5-tribromobenze (71.5 mg, 0.227 mmol), tetrakis(triphenylphosphine) palladium (0) (18.3 mg, 0.016 mmol), 2 M Na$_2$CO$_{3(aq)}$(0.3 cm$^3$), EtOH (0.3 cm$^3$) and toluene (0.7 cm$^3$) was degassed and heated at reflux under argon for 24 h. The resultant orange mixture was allowed to cool and passed through a plug of silica gel using ether as eluent. The filtrate was collected and the solvents were completely removed. The residue was purified by column chromatography over silica gel using light petroleum as eluent to afford 213 mg (83%) of 8 as a colourless oil; $\delta_H$(200 MHz; CDCl$_3$) 0.83-1.05 (24H, m, Me), 1.26-1.64 (32H, m, CH$_2$), 1.68-1.89 (4H, m, CH), 3.94 (8H, m, ArOCH$_2$), 7.05 (8H, ArH), 7.61-7.94 (16H, ArH), and 8.04 (1H, s, ArH).

EXAMPLE 9

G1-DSB (9)

1,4-Bis{3',5'-di[4"-(2'"-ethylhexyloxy)phenyl]styryl}benzene

Anhydrous THF was added to a mixture of G1-CHO 3 (302 mg, 0.587 mmol), 1,4-bis(methylenedimethylphosphonate)benzene (91 mg, 0.281 mmol) and potassium tert-butoxide (79 mg, 0.704 mmol) at room temperature under argon. After stirring for 19 h, the mixture was quenched with 0.5 cm$^3$ of water. The mixture was dried over anhydrous magnesium sulfate and passed through a plug of silica gel using DCM as eluent. The filtrate was collected and the solvent was removed. The mixture was purified by column chromatography over silica gel with ethyl acetate-light petroleum (1:10) as eluent to give the G1-DSB as a mixture of isomers. Isomerisation was carried out by heating the mixture of the G1-DSB, catalytic amount of I$_2$ and toluene (3 cm$^3$) at reflux for 4 h. The mixture was allowed to cool, washed with aqueous sodium metabisulfite solution (10%, 1×5 cm$^3$), dried (MgSO$_4$) and filtered and the solvent was completely removed. The mixture was purified by column chromatography over silica gel using DCM-petroleum (1:4) as eluent to give 179 g (58%) of $\delta_H$(200 MHz; CDCl$_3$) 0.85-1.05 (24H, m, Me), 1.26-1.67 (32H, m, CH$_2$), 1.69-1.90 (4H, m, CH), 3.94 (8H, m, ArOCH$_2$), 7.05 (8H, m, ArH), 7.28 (4H, m, ArH), 7.55-7.72 (18H, ArH & vinyl H); m/z [MALDI] 1099 (M$^+$).

EXAMPLE 10

G1-Zn-Porphyrin (10)

5,10,15,20-Tetra{3',5'-di[4"-(2'"-ethylhexyloxy)phenyl]phenyl}porphinatozinc (II)

A mixture of the G1-CHO 3 (420 mg, 0.816 mmol), distilled pyrrole (0.12 cm$^3$, 1.73 mmol), zinc acetate dihydrate (730 mg, 3.33 mmol) and 7 cm$^3$ of propionic acid was heated at reflux for 5 h. The mixture was allowed to cool and passed through a column of silica gel using DCM-petroleum (1:4) as eluent. The main band was collected and the solvents were removed. The residue was purified by column chromatography using silica gel with DCM-light petroleum (1:4) as eluent to give 120 mg (6%) of 10 as a blue purple solid; $\lambda_{max}$/nm (thin film) 270, 435, 556, and 595; $\delta_H$(200 MHz; CDCl$_3$) 0.81-1.01 (48H, m, Me), 1.20-1.62 (64H, m, CH$_2$), 1.63-1.86 (8H, m, CH), 3.90 (16H, m, ArOCH$_2$), 7.05 (16H, m, ArH), 7.85 (16H, m, ArH), 8.18 (4H, s, ArH), 8.43 (8H, ArH), and 9.20 (8H, s, β-pyrrolic H); m/z [MALDI] 2311 (M$^+$).

EXAMPLE 11

G2-Zn-Porphyrin (11)

5,10,15,20-Tetra(3',5'-di{3",5"-di[4'"-(2''''-ethylhexyloxy)phenyl]phenyl}phenyl)porphinato zinc (II)

A mixture of the G2-CHO 7 (583 mg, 0.542 mmol), distilled pyrrole (0.09 cm$^3$, 1.30 mmol), zinc acetate dihydrate (500 mg, 2.28 mmol) and 4.6 cm$^3$ of propionic acid was heated at reflux for 18 h and then allowed to cool to room temperature. The mixture was passed through a column of silica gel using DCM-light-petroleum (1:4) as eluent. The main band was collected and the solvents were removed. The residue was purified by column chromatography using silica gel with DCM-light petroleum (1:4) as eluent to give ≅130 mg (≅5%) of 11 as a blue purple solid; $\lambda_{max}$/nm (thin film) 270, 433, 554, and 592; $\delta_H$(200 MHz; CDCl$_3$) 0.75-1.01 (96H, m, Me), 1.18-1.59 (128H, m, CH$_2$), 1.60-1.81 (16H, m, CH), 3.83 (32H, m, ArOCH$_2$), 6.94 (32H, m, ArH), 7.62 (32H, m, ArH), 7.52 (8H, s, ArH), 8.00 (16H, m, ArH), 8.43 (4H, s, ArH), 8.65 (8H, m, ArH), and 9.26 (8H, s, β-pyrrolic H).

EXAMPLE 12

Figure 5:
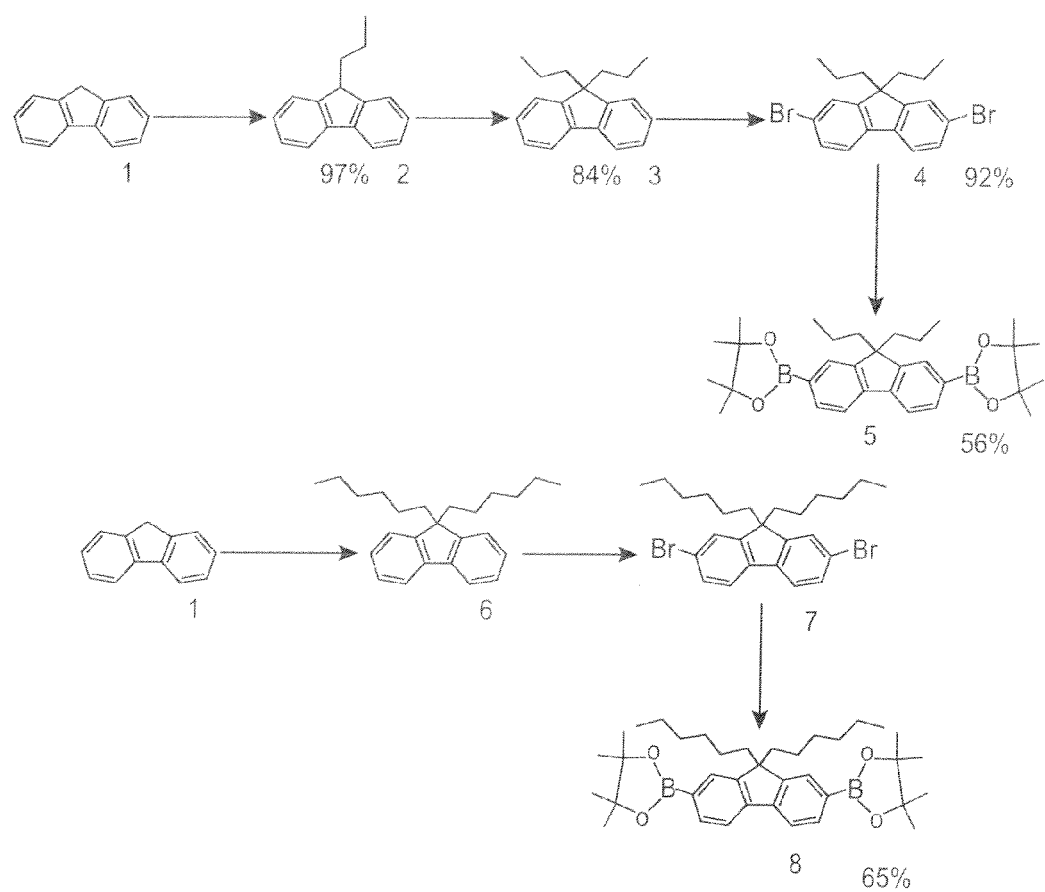
FIGS. 5-8 show different fluorene-based core dendrimers and the preparation steps.
Figure 5:
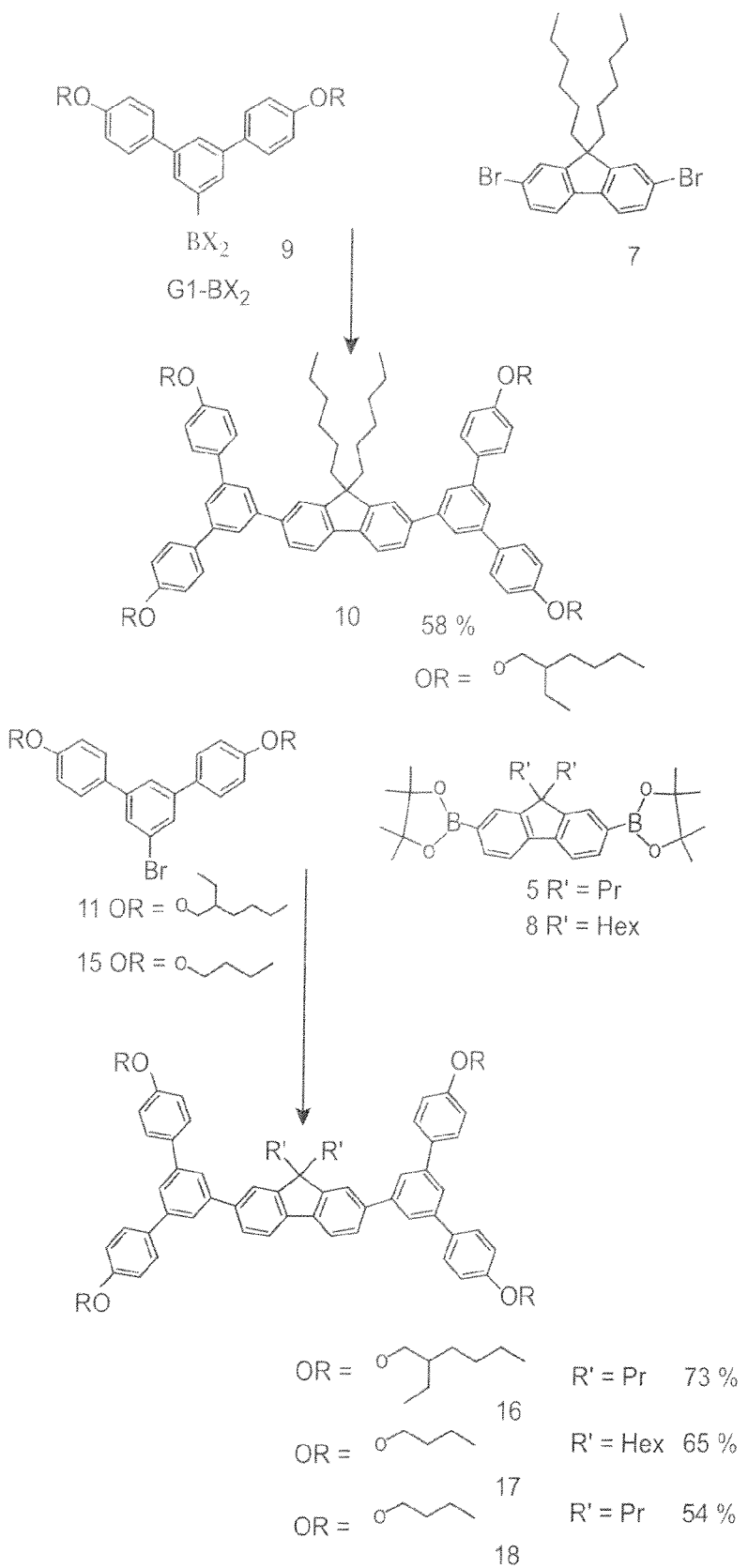
Figure 5:
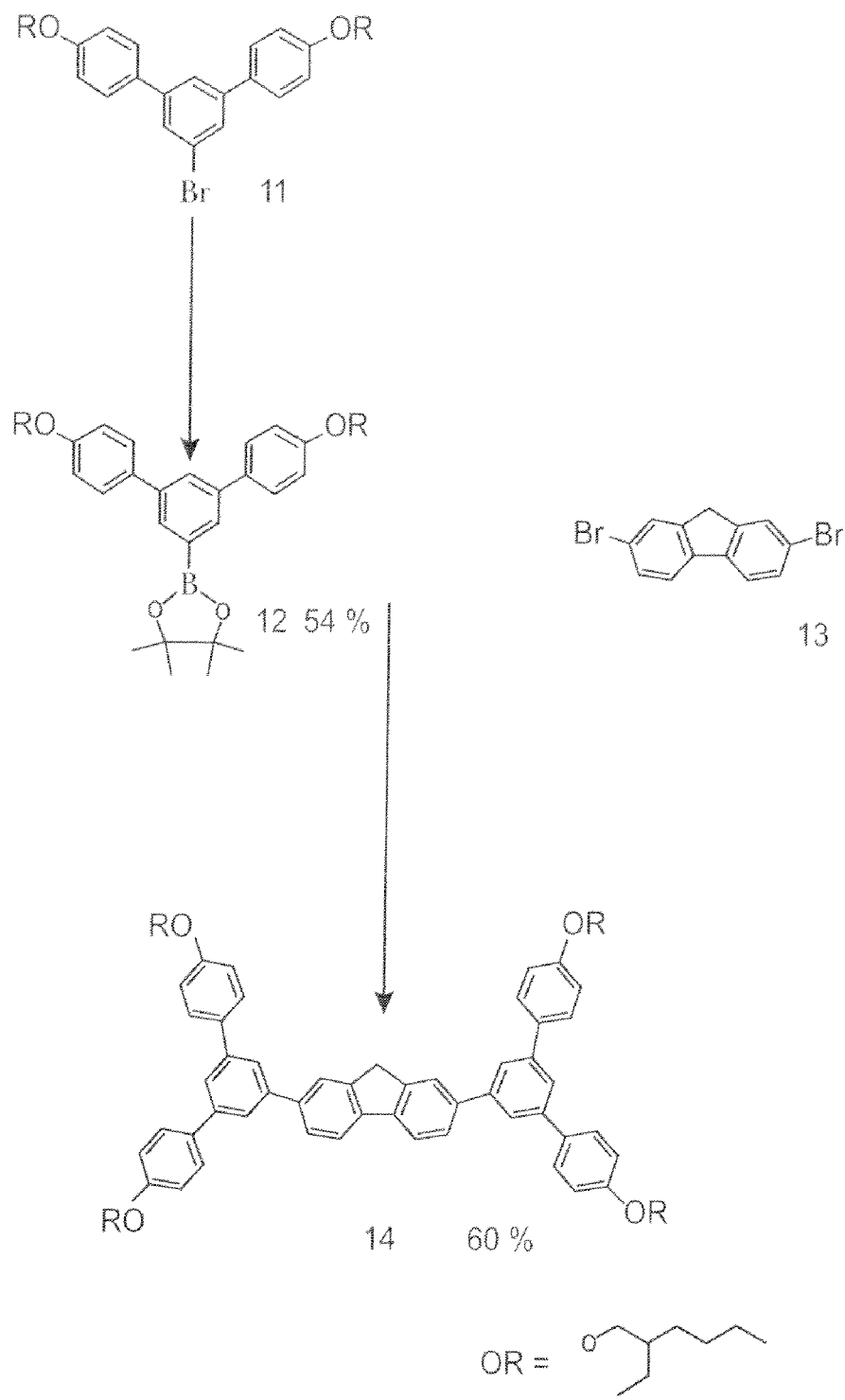

This Example of the synthesis of first generation dendrimers follows FIG. 5, the compound numbering being as given.
9-Propylfluorene (2) 9,9-Dipropylfluorene (3) and 2,7-Dibromo-9,9-dipropylfluorene (4) can be obtained following Kelley et al, J. Chem. Research (M) 1997, 2701.
Compound (5)
tert-Butyllithium (1.7 M in pentane, 8.5 cm$^3$, 0.015 mol) was added dropwise to a solution of 2,7-dibromo-9,9-dipropylfluorene (4) (2.50 g, 6.00 mmol) in dry THF (100 cm$^3$) at −78° C. under argon. The solution was stirred for 1 h and 2-isopropoxy-4,4,5,5-tetramethyl-1,3,2-dioxaborolane (4.0 g, 0.022 mol) was added. The solution was allowed to warm to RT and stirred for 3 d then water (100 cm$^3$) and diethyl ether (100 cm$^3$) added. The aqueous layer was separated, washed with diethyl ether (100 cm$^3$) and the organic layers combined, dried over anhydrous magnesium sulphate, filtered and concentrated to a pale yellow powder which was purified by column chromatography [silica gel, DCM: petroleum ether 40-60° C. 1:4 eluting to 1:2] and recrystallisation from DCM: methanol to yield a white crystalline solid.

Yield 1.7 g (56%); $\delta_H$(200 MHz; CDCl$_3$) 7.75 (m, 6H), 2.0 (t, 4H), 1.39 (s, 24H), 0.62 (m, 10H); m/z [APCI$^+$] 503 (M$^+$), 125, 124, 123, 122; $\nu_{max}$(KBr)/cm$^{-1}$ 3436, 2959, 1608, 1573, 1475, 1424, 1348, 1239, 1147, 1112, 964, 846, 701

Compound (8) can be obtained according to Beaupré et al, Macromol. Rapid Commum., 2000, 21, 1013.

2,7-Bis{3,5-di[4-(2-ethylhexyloxy)phenyl]phen-1-yl}-9,9-dihexylfluorene (10)

A mixture of the G1-boronic acid (9) [G1-BX$_2$ of Example 6] (190 mg 3.58×10$^{-4}$ mol), 2,7-dibromo-9,9-dihexylfluorene (7) (71 mg, 1.4×10$^{-4}$ mol), tetrakis(triphenylphosphine)palladium (0) (13 mg, 1.1×10$^{-5}$ mol), aqueous sodium carbonate (2 M, 0.2 cm$^3$) in toluene (0.5 cm$^3$) and ethanol (0.8 cm$^3$) was heated under reflux for 18 h under argon. Water (5 cm$^3$) and DCM (15 cm$^3$) were added and the organic layer separated, dried over anhydrous magnesium sulphate, filtered and concentrated onto silica gel for purification by column chromatography [silica gel, petroleum ether 40-60° C.: DCM 2:1] to yield a white glassy solid.

Yield 105 mg (58%); (Found: C, 85.77; H, 9.39, requires C, 85.66; H, 9.43); $\delta_H$(200 MHz; CDCl$_3$) 7.62-7.90 (m, 20H), 7.08 (d, 8H), 3.80 (d, 8H), 2.12 (t, 4H), 1.80 (t, 4 H), 1.80 (quint, 4H), 0.72-1.65 (m, 78H); $\nu_{max}$(KBr)/cm$^{-1}$ 3436, 2926, 1609, 1512. 1439, 1285, 1250, 1176, 1033, 822; m/z [MALDI] 1304 (M$^+$)

EXAMPLE 13

2-[4,4''-Bis-(2-ethyl-hexyloxy)-1,1',3',1''-terphenyl-5'-yl]-4,4,5,5-tetramethyl-1,3,2-dioxaborolane (12)

tert-Butyllithium (1.7M solution in pentane, 5.35 cm$^3$, 9.11×10$^{-3}$ mol) was added slowly to a solution of the G1-bromide (11, which is the same as 5 prepared in Example 5) (3.43 g, 6.07×10$^{-3}$ mol) in dry THF (50 cm$^3$) at −78° C. under argon. The solution was stirred at −78° C. for 1 h, 2-isopropoxy-4,4,5,5-tetramethyl-1,3,2-dioxaborolane (4.0 cm$^3$, 22 mmol) was added and the solution allowed to warm to RT and stirred for 3 d. Diethyl ether (75 cm$^3$) was added and the solution washed with water (2×30 cm$^3$). The aqueous layers were combined and washed with diethyl ether (2×50 cm$^3$), the organic layers combined, dried over anhydrous magnesium sulphate, filtered and concentrated to a pale yellow oil which was purified by column chromatography [silica gel, petroleum ether 60-80° C.: DCM 1:1 eluting to DCM] to give a white crystalline solid.

Yield 2.4 g (64%); $\delta_H$(200 MHz; CDCl$_3$) 7.98 (d, 2H), 7.84 (m, 1H), 7.63 (d, 4H), 7.00 (d, 4H), 3.91 (d, 4H), 1.78 (m, 2H), 1.30-1.60 (m, 28H), 0.98 (t, 12H)

2,7-Bis{3,5-di[4-(2-ethylhexyloxy)phenyl]phen-1-yl}-fluorene (14)

A mixture of 2,7-dibromofluorene (13) (Kelley et al loc. cit) (100 mg, 3.10×10$^{-4}$ mol), G1-borolane (12) (0.47 g, 7.7×10$^{-4}$ mol), tetrakis(triphenylphosphine)palladium (0) (15 mg, 1.3×10$^{-5}$ mol), aqueous sodium argon. DCM (20 cm$^3$) and dilute HCl$_{(aq)}$(3M, 15 cm$^3$) were added and the organic layer separated, washed with water (2×10 cm$^3$), dried over anhydrous magnesium sulphate, filtered and concentrated to a brown oil which was purified by column chromatography [silica gel, petroleum ether 40-60° C. eluting to 4:1 petroeum ether 40-60° C.: DCM] to yield a white, glassy solid.

Yield 210 mg (60%)

2,7-Bis{3,5-di[4-(2-ethylhexyloxy)phenyl]phen-1-yl}-9,9-dipropylfluorene (16)

A mixture of the G1-Br (11) (Example 5) (500 mg, 8.85×10$^{-4}$ mol), compound 5 (150 mg, 2.98×10$^{-4}$ mol), tetrakis(triphenylphosphine)palladium (0) (70 mg, 8.1×10$^{-5}$ mol) in toluene (2.5 cm$^3$), methanol (0.8 cm$^3$) and aqueous sodium carbonate (2M, 2.5 cm$^3$) was heated under reflux for 20 h under argon. DCM (20 cm$^3$) and dilute HCl$_{(aq)}$ (3M, 20 cm$^3$) were added, the aqueous layer separated, washed with DCM (10 cm$^3$), the organic layers combined, dried over anhydrous magnesium sulphate, filtered and concentrated to a yellow oil which was purified by column chromatography [petroleum ether 60-80° C.: DCM 4:1 eluting to 2:1] to yield a glassy white solid.

Yield 0.27 g (74%); (Found: C, 85.09; H, 9.46. requires C, 85.66; H, 9.09); $\delta_H$(200 MHz; CDCl$_3$) 7.62-7.90 (m, 20H), 7.04 (d, 8H), 3.92 (d, 8H), 2.12 (t, 4H), 1.80 (t, 4 H), 1.25-1.65 (m, 32H), 0.95 (m, 24H), 0.72 (m, 10H); $\nu_{max}$(KBr)/cm$^{-1}$ 2926, 1608, 1512, 1465, 1439, 1250, 1176, 1035, 822

2,7-Bis{3,5-di[4-(butyloxy)phenyl]phen-1-yl}-9,9-dihexylfluorene (17)

A mixture of the G1-bromide (15) (350 g, 7.68×10$^{-4}$ mol), compound 8 (150 mg, 2.56×10$^{-4}$ mol), tetrakis(triphenylphosphine)palladium (0) (50 mg, 5.3×10$^{-5}$ mol) in toluene (2.5 cm$^3$), methanol (0.8 cm$^3$) and aqueous sodium carbonate (2M, 0.8 cm$^3$) was heated under reflux for 20 h under argon. DCM (20 cm$^3$) and dilute HCl$_{(aq)}$ (3M, 20 cm$^3$) were added, the aqueous layer separated, washed with DCM (10 cm$^3$), the organic layers combined, dried over anhydrous magnesium sulphate, filtered and concentrated to a yellow oil which was purified by column chromatography [petroleum ether 60-80° C.: DCM 6:1 eluting to 4:11 to yield a glassy white solid.

Yield 149 mg (54%); $\delta_H$(200 MHz; CDCl$_3$) 7.62-7.90 (m, 20H), 7.04 (d, 8H), 4.05 (t, 8H), 2.05 (t, 4H), 1.81 (quint, 8H), 1.51 (quint, 8H), 1.05 (m, 10H), 0.72 (m, 10H); $\nu_{max}$(KBr)/cm$^{-1}$ 2928, 1609, 1512, 1473, 1440, 1284, 1250, 1177, 823.

FIG. 5:

2,7-Bis{3,5-di[4-(butoxy)phenyl]phen-1-yl}-9,9-dipropylfluorene (18)

A mixture of compound 5 (150 mg, 2.98×10$^{-4}$ mol, compound 15 (400 mg, 8.80×10$^{-4}$ mol), tetrakis(triphenylphosphine)palladium (0) (70 mg, 8.1×10$^{-5}$ mol) in toluene (2.5 cm$^3$), aqueous sodium carbonate (2 M, 0.8 cm$^3$) and ethanol (4 cm$^3$) was heated under reflux for 3 d under argon. DCM (10 cm$^3$) and dilute HCl$_{(aq)}$ (3 M, 5 cm$^3$) were added, the aqueous layer separated, washed with DCM (2×5 cm$^3$), the organic layers combined, dried over anhydrous magnesium sulphate, filtered, concentrated to a pale yellow oil and purified by column chromatography [petroleum ether 40-60° C.: DCM 2:1] to yield a white powder.

Yield 158 mg (53%); (Found: C, 85.45; H, 7.95; requires C, 85.67; H, 7.90); $\delta_H$(200 MHz; CDCl$_3$) 7.72 (m, 20H), 7.05 (m, 7H), 4.08 (t, 8H), 2.50 (t, 4H), 1.82 (quint, 8 H), 1.54

(quint, 8H), 1.02 (t, 12H), 0.72 (m, 10H); $v_{max}$(KBr)/cm$^{-1}$ 3436, 2955, 1609, 1512, 1473, 1439, 1283, 1249, 1176, 822; m/z [MALDI] 994 (M$^+$)

Figure 8:
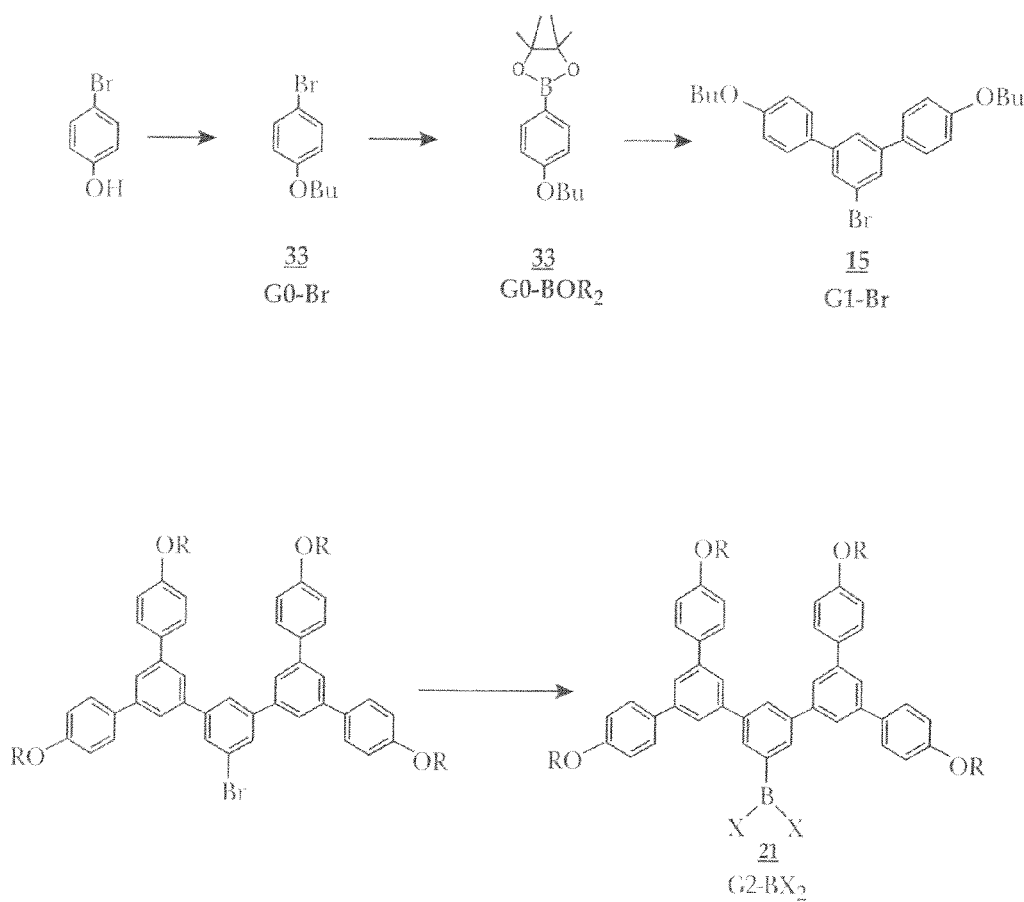

The G1-bromide (15) used in preparation of both (17) and (18) was prepared as follows and as shown in FIG. 8.

FIG. 8:

G0-Br 4-Butoxyphenylbromide, 32

A suspension of powered KOH (48 g, 856 mmol) in anhydrous DMSO (dried over molecular sieve) (250 cm$^3$) was completely degassed. p-Bromophenol (34.6 g, 200 mmol) and 1-bromobutane (142 cm$^3$, 800 mmol) were added to the mixture. The reaction was stirred at room temperature for 21 h under Ar$_{(g)}$ before being cooled in a ice-bath. Ice/water (~200 cm$^3$) was added to the mixture. The two layers were separated. The aqueous layer was extracted with petroleum (40-60° C.) (3×100 cm$^3$). The organic layer and the petroleum extracts were combined, washed with brine (1×150 cm$^3$) and dried (MgSO$_4$). The solvent was removed to leave a pale yellow oil. Purification by column chromatography over silica gel using light petroleum gave a mixture of the 4-butoxyphenylbromide and small amount of 1-bromobutane which was removed by high vacuum to leave 44.1 g (96%) of 32 as a pale yellow oil; (Found: C, 52.3; H, 5.8, $C_{10}H_{13}BrO$ requires C, 52.4; H, 5.7%); $d_H$(400 MHz; CDCl$_3$) 0.99 (3H, t, J=7.4 Hz, Me), 1.46-1.58 (2H, m, CH$_2$), 1.72-1.83 (2H, m, CH$_2$), 3.93 (2H, t, J=6.5 Hz, ArOCH$_2$), 6.79 (2H, m, ArH), and 7.37 (2H, m, ArH); $d_C$(101 MHz; CDCl$_3$) 13.8, 19.2, 31.2, 67.9, 112.5, 116.3, 132.1, and 158.2; m/z [EI] 228, 230 (M$^+$).

G0-BOR$_2$

1-Butoxy-4-(4',4',5',5'-tetramethyl-1',3',2'-dioxaborolan-2'-yl)benzene, 33

Tert-butyl lithium (1.5 M, 23.4 cm$^3$, 35.1 mmol) was added to a cold (dry-ice/acetone bath) solution of 32 (5.00 g, 21.9 mmol) in 90 cm$^3$ of anhydrous THF under an argon atmosphere. The mixture was stirred at −78° C. for 1 h and then 2-isopropoxy-4,4,5,5-tetramethyl-1,3,2-dioxaborolane (5.4 cm$^3$, 26.3 mmol) was added rapidly to the cold mixture. The reaction was stirred at −78° C. for 2 h and the dry-ice/acetone bath was removed. The mixture was then stirred at room temperature for further 22 h before being quenched with H$_2$O (40 cm$^3$). The two layers were separated. The aqueous layer was extracted with ether (3×30 cm$^3$). The organic layer and the ether extracts were combined and dried over anhydrous magnesium sulfate and the solvents were completely removed. Purification of these crude mixture by column chromatography over silica gel using ethyl acetate-light petroleum (0:1 to 1:10) as eluent gave 4.09 g (68%) of 33 as a light yellow oil; (Found: C, 69.5; H, 9.1. $C_{16}H_{25}BO_3$ requires C, 69.6; H, 9.1; N, 5.0%); $d_H$(400 MHz; CDCl$_3$) 0.99 (3H, t, J=7.4 Hz, Me), 1.35 (12H, s, Me), 1.46-1.59 (2H, CH$_2$), 1.73-1.84 (2H, m, CH$_2$), 4.00 (2H, t, J 6.5 Hz, ArOCH$_2$), 6.90 (2H, ArH), and 7.76 (2H, m, ArH); $d_C$(101 MHz; CDCl$_3$) 13.8, 19.2, 24.8, 31.2, 67.4, 83.5, 113.8, 136.5, and 161.7; m/z [EI] 276 (M$^+$).

G1-Br 3,5-Di(4'-butoxyphenyl)phenyl bromide, 15 (also in FIG. 5)

A mixture of the boronic compound 33 (3.80 g, 13.8 mmol), 1,3,5-tribromobenzene (1.97 g, 6.25 mmol), tetrakis(triphenylphosphine) palladium (0) (400 mg, 0.346 mmol), 2 M Na$_2$CO$_{3(aq)}$(6 cm$^3$), EtOH (6 cm$^3$) and toluene (18 cm$^3$) was degassed and then heated at reflux under argon for 69 h. The mixture was allowed to cool. Water (5 cm$^3$) and ether (5 cm$^3$) were added to the mixture. The two phases were separated. The aqueous layer was extracted with ether (3×20 cm$^3$). The organic layer and the ether extracts were combined and dried over anhydrous magnesium sulfate. The solvents were completely removed. The residue was purified by column chromatography over silica gel using light DCM-light petroleum (60-80° C.) (0:1 to 1:20) as eluent to give 1.71 g (60%) of 15 as a white solid; (Found: C, 68.7; H, 6.5. $C_{26}H_{29}BrO_2$ requires C, 68.9; H, 6.5%); $d_H$(400 MHz; CDCl$_3$) 0.99-1.09 (6H, Me), 1.50-1.63 (4H, m, CH$_2$), 1.79-1.90 (4H, m, CH$_2$), 4.03 (4H, t, J=6.5 Hz, ArOCH$_2$), 7.00 (4H, m, ArH), 7.54 (4H, m, ArH), and 7.63 (3H, m, ArH); $d_C$(101 MHz; CDCl$_3$) 13.9, 19.3, 31.3, 67.8, 114.8, 123.2, 123.8, 127.8, 128.2, 132.0, 143.2, and 159.2; m/z [EI] 452, 454 (M$^+$).

Besides, 717 mg (22%) of tri-substituted product was isolated as a white solid; (Found: C, 82.3; H, 8.1. $C_{36}H_{42}O_3$ requires C, 82.7; H, 8.1%); $d_H$(500 MHz; CDCl$_3$) 1.02 (9H, t, J=7.4 Hz, Me), 1.50-1.60 (6H, m, CH$_2$), 1.78-1.89 (6H, m, CH$_2$), 4.04 (6 H, t, J=6.5 Hz, ArOCH$_2$), 7.02 (6H, m, ArH), 7.63 (6H, m, ArH), and 7.67 (3H, ArH); $d_C$(126 MHz; CDCl$_3$) 13.8, 19.2, 31.2, 67.7, 114.7, 123.6, 128.2, 133.5, 141.7, and 159.8; m/z [MALDI] 522, 523, 524 (M$^+$).

EXAMPLE 14

Figure 6:
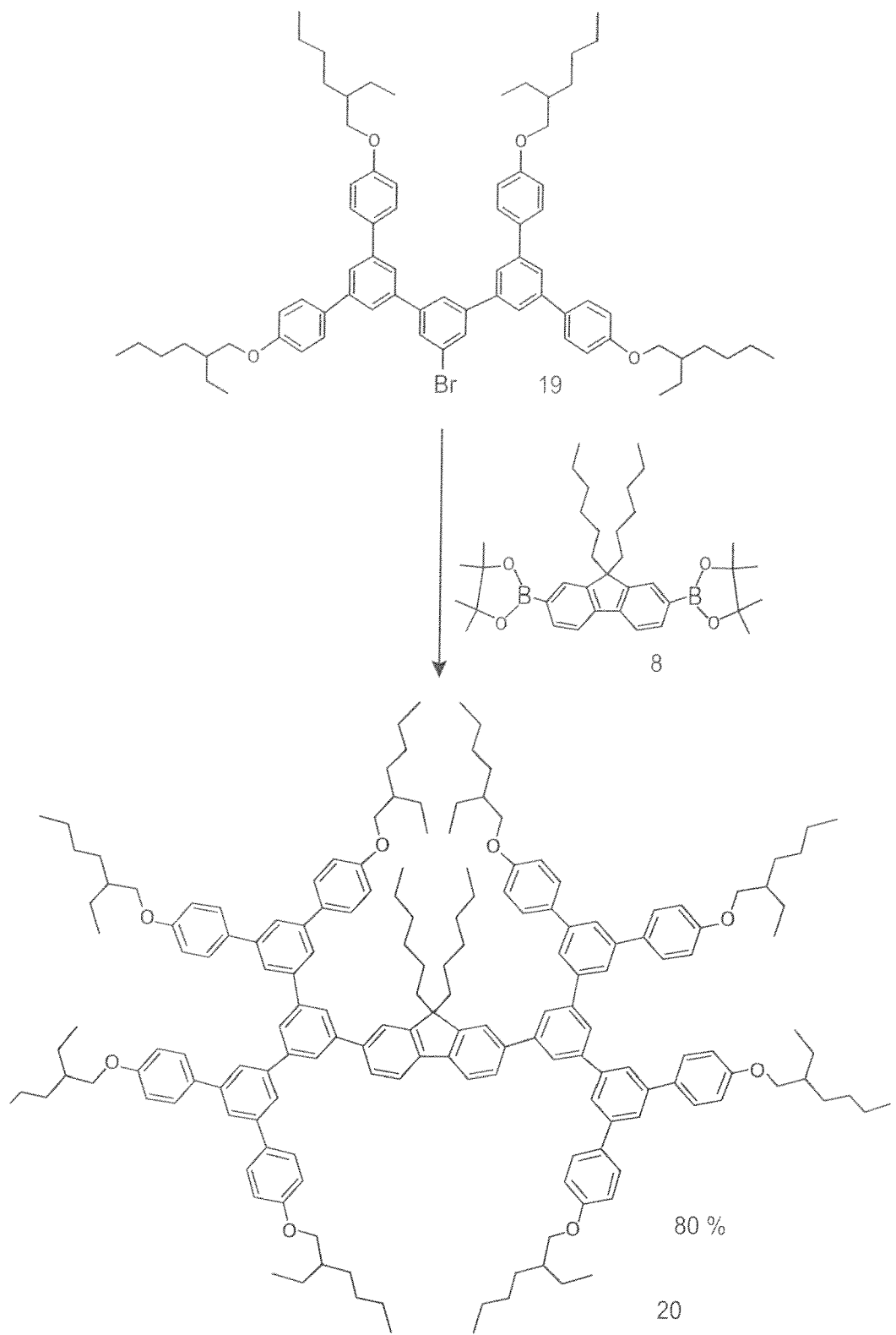
Figure 6:
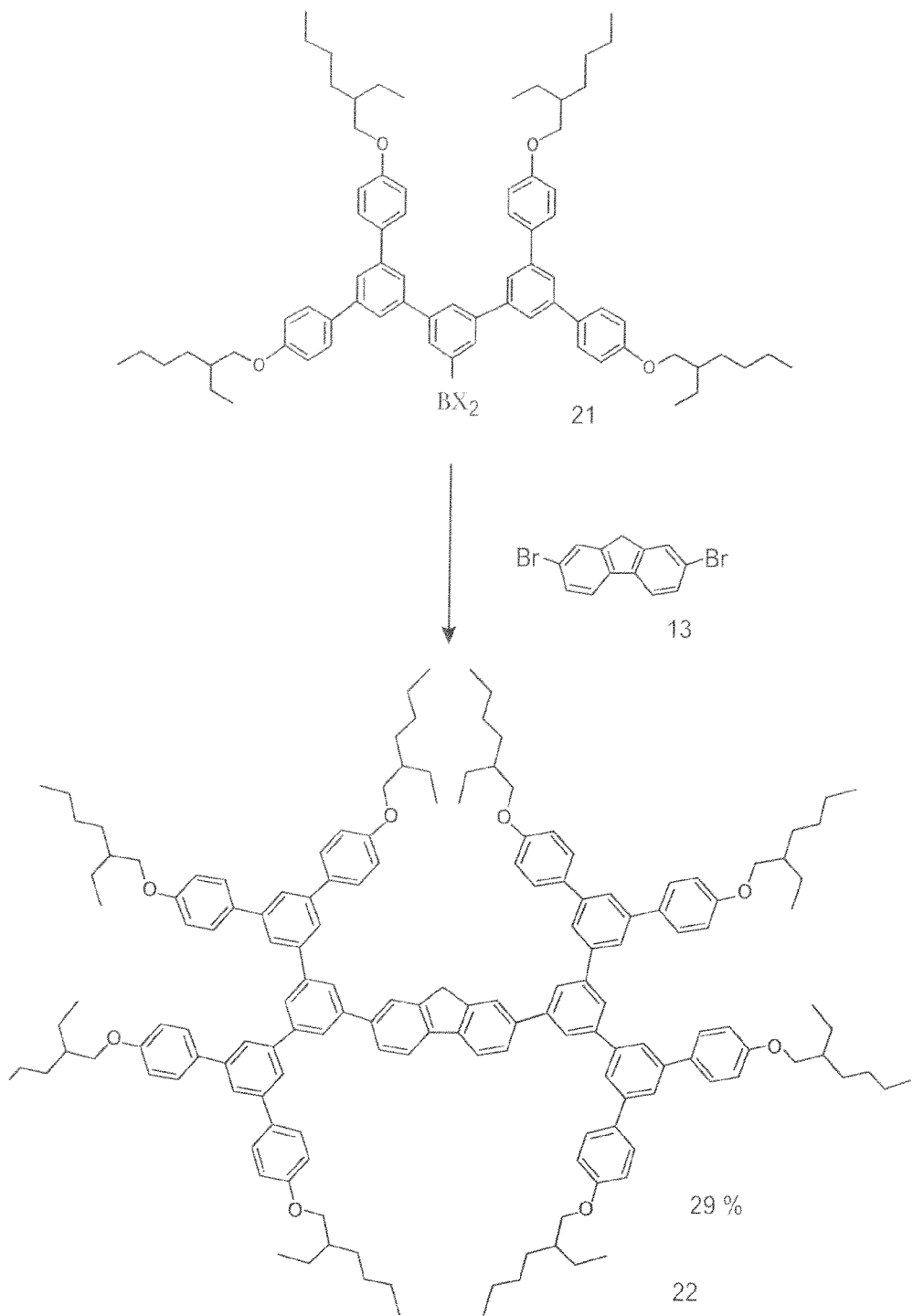

This follows FIG. 6.

2,7-Bis(3,5-di{3,5-di[4-(2-ethylhexyloxy)phenyl] phen-1-yl}phen-1-yl)-9,9-dihexylfluorene (20)

A mixture of the G2-bromide (19 [which is the same as 8 prepared in Example 8] (1.00 g, 8.89×10$^{-4}$ mol), compound 8 (173 mg, 2.96×10$^{-4}$ mol), tetrakis(triphenylphosphine)palladium (0) (70 mg, 8.1×10$^{-5}$ mol) in toluene (3 cm$^3$), methanol (2 cm$^3$) and aqueous sodium carbonate (2M, 2 cm$^3$) was heated under reflux for 20 h under argon. DCM (20 cm$^3$) and dilute HCl$_{(aq)}$(3M, 20 cm$^3$) were added, the aqueous layer separated, washed with DCM (10 cm$^3$), the organic layers combined, dried over anhydrous magnesium sulphate, filtered and concentrated to a yellow oil which was purified by column chromatography [petroleum ether 60-80° C.: DCM 6:1 eluting to 4:1] to yield a glassy white solid.

Yield 0.57 g (80%); (Found: C, 85.16; H, 9.40; requires C, 85.66; H, 9.06); $v_{max}$(KBr)/cm$^{-1}$ 3436, 2927, 1609, 1589, 1512, 1463, 1285, 1249, 1177, 826 m/z [MALDI] 2425 (M$^+$)

FIG. 8:

G2-BX$_2$

The G2-BX$_2$ (21) was prepared as follows (see FIG. 8).

Tert-butyl lithium (1.7 M, 0.4 cm$^3$, 0.644 mmol) was added to a cold (dry-ice/acetone bath) solution of the aryl bromide G2-Br, prepared in Example 8, (454 mg, 0.403 mmol) in 3 cm$^3$ of anhydrous THF under argon atmosphere. The mixture was stirred at −78° C. for 1.5 h. Tributyl borate (0.7 cm$^3$, 2.59 mmol) was added to the mixture and the reaction was stirred at −78° C. for 1.5 h and then room temperature for further 3 h before being quenched with 3 M HCl$_{(aq)}$(1 cm$^3$). The mixture was diluted with water (2 cm$^3$) and ether (3 cm$^3$). The two layers were separated. The aqueous layer was extracted with ether (3×4 cm$^3$). The organic layer and the ether extracts were combined, washed with brine (1×8 cm$^3$) and dried over anhydrous magnesium sulfate. The solvents were completely removed. Purification on silica gel column using ethyl acetate-light petroleum (0:1 to 1:10) as eluent gave 376 mg (~86%) of 21, where BX$_2$ represents a boron based functionality, where the B(OBu)$_2$ is partially hydrolysed, at its foci as a pale yellow oil; $d_H$(200 MHz; CDCl$_3$) 0.83-1.02 (24H, m, Me), 1.22-1.62 (32H, m, CH$_2$), 1.65-1.83 (4H, m, CH), 3.91 (8H, m, ArOCH$_2$), 7.02 (8H, m, ArH), 7.64 (8H, m, ArH), 7.72-7.83 (6H, m, ArH), and 8.02-8.12 (3H, m, ArH).

FIG. 6:

2,7-Bis(3,5-di{3,5-di[4-(2-ethylhexyloxy)phenyl]phen-1-yl}phen-1-yl)fluorene (22)

A mixture of the G2-BX$_2$ (21) (FIG. 8) (148 mg, 0.136 mmol), 2,7-dibromofluorene (13) (17 mg, 0.054 mmol), tetrakis(triphenylphosphine)palladium (0) (5 mg, 4.3×10$^{-6}$ mol), aqueous sodium carbonate (2M, 0.2 cm$^3$), ethanol (0.2 cm$^3$) and toluene (0.5 cm$^3$) was degassed and heated under reflux for 20 h under argon. The crude was purified by column chromatography [silica gel, petroleum ether 40-60° C. eluting to petroleum ether 40-60° C.: ethyl acetate 10:1] to give an impure product which was further purified by column chromatography [silica gel, petroleum ether 40-60° C. eluting to petroleum ether 40-60° C.: ethyl acetate 30:1].

Yield 36.4 mg (30%) $\delta_H$(400 MHz; CDCl$_3$) 7.74-8.02 (m, 24H), 7.65 (d, 16H), 7.03 (d, 16H), 4.13 (s, 2H), 3.92 (d, 16H), 1.77 (m, 8H), 1.25-1.60 (m, 64), 0.85-1.00 (m, 48H), m/z [MALDI] 2255 (M$^+$). The G2-Bx$_2$ (2)) was prepared as follows (see FIG. 8):

EXAMPLE 15

Figure 7:
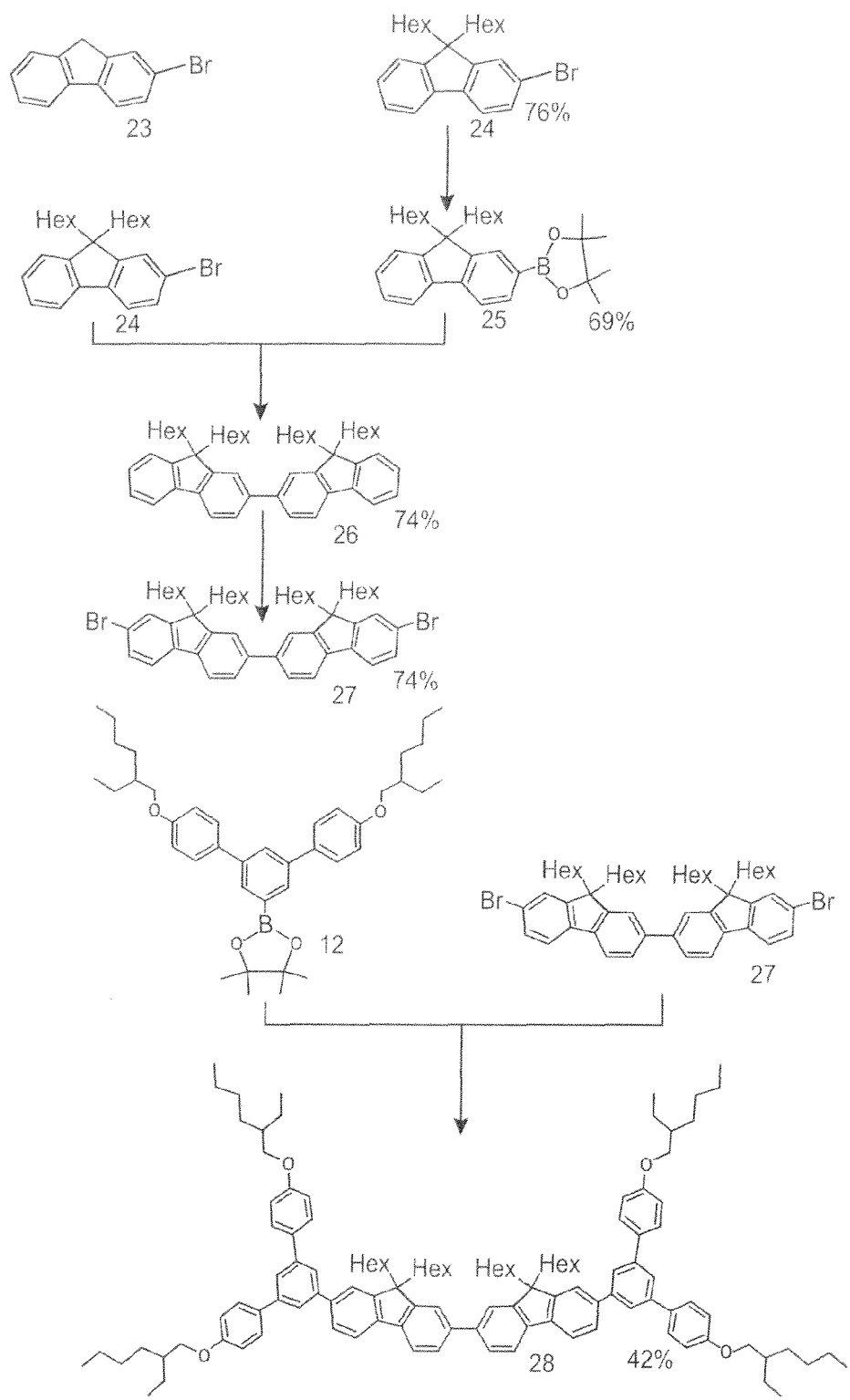
Figure 7:
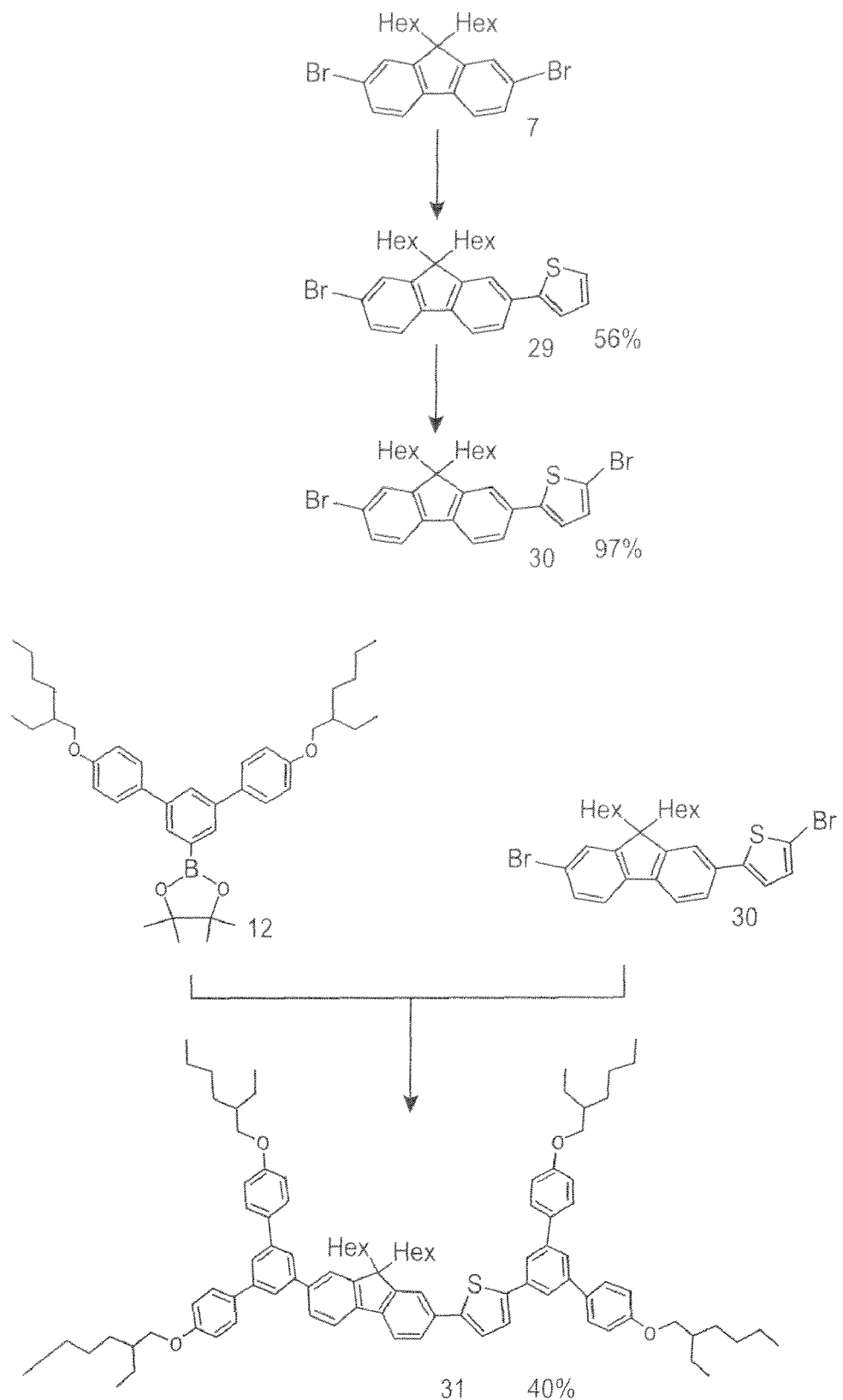

This follows FIG. 7.

2-Bromo-9,9-dihexylfluorene (24) 9,9,9',9'-Tetrahexyl-2,2'-bifluorenyl (26) and 7,7'-Dibromo-9,9,9',9'-tetrahexyl-[2,2]bifluorenyl (27) can be obtained following Lee et al, Thin Solid Films, 2000, 363, 76 while 2-(9,9-Dihexylfluoren-2-yl)-4,4,5,5-tetramethyl-1,3,2-dioxaborolane (25) can be obtained following Ranger et al, Macromolecules, 1997, 30, 7686.

7,7'-Bis-[4,4''-bis-(2-ethyl-hexyloxy)-[1,1';3',1'']terphenyl-5'-yl]-9,9,9',9'-tetrahexyl-[2,2']-bifluorenyl (28)

A mixture of compound 27 (150 mg, 1 82×10$^{-4}$ mol), compound 12 (FIG. 5) (279 mg, 4.55×10$^{-4}$ mol), tetrakis(triphenylphosphine)palladium (0) (16 mg, 1.37×10$^{-5}$ mol) in aqueous sodium carbonate (2M 0.5 cm$^3$), ethanol (0.5 cm$^3$) and toluene (2 cm$^3$) was heated under reflux for 24 h under argon. Dilute HCl$_{(aq)}$(3M, 5 cm$^3$) and DCM (10 cm$^3$) were added and the organic layer separated, washed with water (10 cm$^3$), dried over anhydrous magnesium sulphate, filtered and concentrated to a brown oil which was purified by column chromatography [silica gel, petroleum ether 40-60° C.: DCM 4:1] to yield a white glassy solid.

Yield 124 mg (42%); (Found: C, 84.78; H, 9.56; requires C, 86.60; H, 9.49); $\delta_H$(200 MHz; CDCl$_3$) 7.61-7.85 (m, 26H) 7.04 (m, 8H), 3.98 (d, 8H), 2.10 (t, 4H), 1.78 (m, 4H), 0.72-1.60 (m, 78H); $\nu_{max}$(KBr)/cm$^{-1}$ 2926, 1608, 1512, 1464, 1441, 1284, 1251, 1176, 1034, 815; m/z [MALDI] 1635 (M$^+$)

2-(7-Bromo-9,9-dihexylfluoren-2-yl)-thiophene (29)

A mixture of 2,7-dibromo-9,9-dihexylfluorene (7) (8.0 g, 16 mmol), 2-tributylstannylthiophene (2.98 g, 8.0 mmol), tetrakis(triphenylphosphine)palladium (0) (200 mg, 1.73×10$^{-4}$ mol) aqueous sodium carbonate (2M, 2 cm$^3$), toluene (5 cm$^3$) and ethanol (2 cm$^3$) was heated under reflux for 24 h under argon. Toluene and ethanol were removed and hexane (10 cm$^3$) and aqueous KI (2%, 10 cm$^3$) added and the mixture stirred vigorously for 1 h. Diethyl ether (10 cm$^3$) and dilute HCl$_{(aq)}$(3M, 10 cm$^3$) were added, the aqueous layer separated and washed with diethyl ether (2×10 cm$^3$). The organic layers were combined, dried over anhydrous magnesium sulphate, filtered and concentrated to a dark brown oil which was purified by column chromatography [silica gel, hexane] to yield a pale jade coloured oil.

Yield 2.23 g (56%); $\delta_H$(200 MHz; CDCl$_3$) 7.08-7.75 (m, 9H), 1.98 (m, 4H), 1.10 (m, 12H), 0.78 (t, 6H), 0.65 (quint, 4H); $\nu_{max}$(KBr)/cm$^{-1}$ 3435, 2856, 1456, 1377, 1062, 812, 694; m/z [APCI$^+$] 496 (M$^+$), 417

2-Bromo-5-(7-bromo-9,9-dihexylfluoren-2-yl)-thiophene (30)

NBS (0.73 g, 4.11×10$^{-3}$ mol, freshly recrystallised) was added slowly to a solution of 2-(7-Bromo-9,9-dihexylfluoren-2-yl)-thiophene (29) (1.85 g, 3.74×10$^{-3}$ mol) in chloroform (20 cm$^3$) and glacial acetic acid (20 cm$^3$) whilst heating under reflux. The solution was allowed to heat for a further 3 mins, cooled to RT and aqueous sodium metabisulphite solution (10 cm$^3$) was added. The organic layer was separated, washed with water (2×10 cm$^3$), aqueous sodium carbonate (2M, 2×10 cm$^3$), water (2×10 cm$^3$), dried over anhydrous magnesium sulphate, filtered and concentrated to a green oil.

Yield 2.08 g (97%) $\delta_H$(200 MHz; CDCl$_3$) 7.42-7.72 (m, 6H), 7.14 (d, 1H), 7.08 (d, 1H), 1.98 (m, 4H), 1.10 (m, 12H), 0.78 (t, 6H), 0.68 (quint, 4H); $\nu_{max}$(KBr)/cm$^{-1}$ 2954, 1599, 1456, 1245, 1062, 1005, 880, 814, 791

2-[4,4''-Bis-(2-ethyl-hexyloxy)-[1,1';3',1'']terphenyl-5'-yl]-5-{7-[4,4''-bis-(2-ethyl-hexyloxy)-[1,1';3',1'] terphenyl-5'-yl]-9,9-dihexyl-fluoren-2-yl}-thiophene (31)

A mixture of compound 30 (200 mg, 3.48 10$^{-4}$ mol), compound 12 (FIG. 5) (530 mg, 8.71×10$^{-4}$ mol), tetrakis(triphenylphosphine)palladium (0) (30 mg, 2.6×10$^{-5}$ mol), aqueous sodium carbonate (2M, 0.5 cm$^3$), methanol (0.5 cm$^3$) and toluene (2 cm$^3$) was heated under reflux for 4 d under argon. Dilute HCl$_{(aq)}$(3M, 10 cm$^3$) and DCM (10 cm$^3$) were added, the organic layer separated, washed with water (100 cm$^3$), dried over anhydrous magnesium sulphate, filtered, concentrated to a brown oil and purified by column chromatography [silica gel, DCM:hexane 1:4] to yield a green glassy solid.

Yield 220 mg, (46%); (Found: C, 83.58; H, 9.52; S, 2.26 requires C, 84.05; H, 9.02; S, 2.31); $\delta_H$(400 MHz; CDCl$_3$) 7.61-7.82 (m, 20H), 7.45 (d, 1H), 7.42 (d, 1H), 7.04 (m, 8H), 3.98 (d, 8H), 2.10 (t, 4H), 1.78 (m, 4H), 0.72-1.60 (m, 78H); $\nu_{max}$(KBr)/cm$^{-1}$ 2927, 1608, 1512, 1460, 1441, 1284, 1250, 1177, 1033, 825; m/z [MALDI] 1285 (M$^+$)

EXAMPLE 16

| Compound | Device structure | Peak efficiency (PE) (cd/A) | Voltage at PE | Brightness at PE (cd/m$^2$) | Max brightness and voltage cd/m$^2$ at V | Turn on voltage (V) |
|---|---|---|---|---|---|---|
| 10* Ex 12 | ITO/PEDOT (50 nm)/10 (60 nm)/ Ca (20 nm)/Al (100 nm) | 0.09 | 33 | 24 | 24 at 33 | 20 |

-continued

| Compound | Device structure | Peak efficiency (PE) (cd/A) | Voltage at PE | Brightness at PE (cd/m$^2$) | Max brightness and voltage cd/m$^2$ at V | Turn on voltage (V) |
|---|---|---|---|---|---|---|
| 10† | ITO/PEDOT (50 nm)/10 (80 nm)/ Ca (20 nm)/Al (100 nm) | 0.2 | 34 | 35 | 35 at 21 | 21 |
| 17 Ex 13 | ITO/PEDOT (50 nm)/17 (100 nm)/ Ca (20 nm)/Al (100 nm) | 0.1 | 14 | 13 | 35 at 12 | 7.0 |
| 18 Ex 13 | ITO/PEDOT (50 nm)/18 (100 nm)/ Ca (20 nm)/Al (100 nm) | 0.3 | 9.0 | 15 | 55 at 12 | 7.0 |
| 20 Ex 14 | ITO/PEDOT (50 nm)/20 (100 nm)/ Ca (20 nm)/Al (100 nm) | 0.1 | 21 | 13 | 34 at 23 | 12.8 |
| 28 Ex 15 | ITO/PEDOT (50 nm)/28 (100 nm)/ Ca (20 nm)/Al (100 nm) | 0.1 | 9.0 | 65 | 130 at 12 | 5.0 |
| 28 | ITO/PEDOT (50 nm)/PVK (30 nm)/ 28 (80 nm)/Ca (20 nm)/Al (100 nm) | 0.3 | 8.0 | 100 | 335 at 11 | 4.0 |
| 31 Ex 15 | ITO/PEDOT (50 nm)/31 (100 nm)/ Ca (20 nm)/Al (100 nm) | 0.3 | 9.0 | 135 | 460 at 12 | 5.0 |
| 31 | ITO/PEDOT (50 nm)/PVK (30 nm)/ 31 (80 nm)/Ca (20 nm)/Al (100 nm) | 1.1 | 7.0 | 127 | 1905 at 10 | 3.8 |
| 28 & 31 | ITO/PEDOT (50 nm)/PVK (30 nm)/ 28:31 (50:50 wt %) (80 nm)/ Ca (20 nm)/Al (100 nm) | 0.94 | 8.4 | 265 | 3100 at 12 | 3.8 |

The devices tested above were prepared as follows:
1. Etch ITO squares 12×12 mm into 4×12 mm ITO strip by acid etch
2. Acetone rinse for 10 minutes with ultrasonication
3. Propan-2-ol rinse for 10 minutes with ultrasonication
4. Substrates dried under dry nitrogen flow
5. Substrates subject to oxygen plasma treatment for 5 minutes at 100 W
6. PEDOT spun from water solution at 2500 rpm for 1 minute
7. PEDOT layer dried in air at 85° C. for 5 minutes
8. Dendrimer film deposited by spin coating
9. Substrates placed in vacuum evaporator
10. 20 nm of calcium deposited at 0.1 nm/s under vacuum of $1 \times 10^{-6}$ mBar
11. 100 nm of aluminium deposited at 0.1 nm/s under vacuum of $1 \times 10^{-6}$ mBar Preparation of a PVk Layer
1. PVK solution prepared 6 m/ml in amylene stabilised CHCl3
2. Films spun onto ITO cleaned as previously described at 4000 rpm for 1 min
3. Films dried at 65° C. in nitrogen atmosphere for 20 minutes
4. Films allowed to cool
5. Top dendrimer layer spin coated from toluene For 10* the dendrimer was spin-coated from chloroform whilst for 10† tetrahydrofuran was used.

The approximate CIE coordinates of the EL emission from a neat layer of 31 are x=0.16, y=0.2, from a neat layer of 28 are x=0.17, y=0.09, and from a blend of 31 and 28 are x=0.16, y=0.11.

Devices made with a neat layer of dendrimer 31 (fluorene-thiophene core) are more efficient than those made with a neat layer of 28 (bifluorene core) but the color is blue-green rather than deep blue. hence it can be advantageous to blend the dendrimers, as the device using mixture of 28 and 31 has both a deep blue color and a good efficiency. The use of a hole-transporting layer (PVK) can improve the efficiency and lower the turn on voltage of the devices.

What is claimed is:

1. A light-emitting device incorporating as its light emitting element at least one compound having the formula (I):

$$\text{CORE-[DENDRITE(-Q)}_a]_n \qquad (I)$$

in which CORE is a metallic chromophore which is a metalloporphyrin, n represents an integer of at least 1, Q is a proton or a surface group, a is an integer and DENDRITE, which may be the same or different if n is greater than 1, represents a conjugated dendritic structure comprising aryl and/or heteroaryl groups connected to each other via bonds between sp$^2$ hybridized ring atoms of said aryl or heteroaryl groups, CORE terminating in the first single bond which is connected to an sp$^2$ hybridized ring atom of an (hetero)aryl group to which more than one conjugated dendritic branch is attached, said atom forming part of the DENDRITE, the CORE and/or DENDRITE being luminescent, and wherein the light emitting element is obtainable by deposition using solution processing.

2. A device according to claim 1 wherein at least one DENDRITE represents a conjugated dendritic structure comprising aryl and/or heteroaryl groups connected to each other via bonds between sp$^2$ hybridized ring carbon atoms of said aryl or heteroaryl groups.

3. A device according to claim 1 wherein at least one DENDRITE contains a phenyl branching group linked directly to at least one aryl branching group which is not phenyl.

4. A device according to claim 1 wherein at least one DENDRITE contains a phenyl branching group linked to one or more phenyl branching groups via an aryl linker.

5. A device according to claim 1 wherein the distal aryl groups of the DENDRITES of the light emitting element are substituted by one or more Q which are surface groups and which may be the same or different.

6. A device according to claim 1 wherein the said light emitting element is preparable by a convergent route.

7. A device according to claim 1 which comprises a layer of said light emitting element together with one or more layers of other materials.

8. A device according to claim 7 wherein the one or more layers of other materials comprises a hole-transporting layer.

9. A device according to claim 7 wherein the one or more layers of other materials comprises an electron transporting layer.

10. A device according to claim 1 which is a light emitting diode (LED).

11. A device according to claim 1 wherein the compound of formula (I) is blended with another dendrimer and/or polymer and/or molecular compound.

12. A device according to claim 1 in which at least one Q is a surface group selected from branched and unbranched alkyl, branched and unbranched alkoxy, hydroxy, alkylsilane, carboxy, carbalkoxy, and vinyl; a further-reactable alkene, (meth)acrylate, sulphur-containing, or silicon-containing group; a sulphonyl group; a polyether group; a $C_1$ to $C_{15}$ alkyl group; an amine group; a mono-, di- or tri-$C_1$ to $C_{15}$ alkyl amine group; a —COOR group wherein R is hydrogen or $C_1$ to $C_{15}$ alkyl; an —OR group wherein R is hydrogen, aryl, or $C_1$ to $C_{15}$ alkyl or alkenyl; an —O$_2$SR group wherein R is $C_1$ to $C_{15}$ alkyl or alkenyl; an —SR' group wherein R' is aryl, or $C_1$ to $C_{15}$ alkyl or alkenyl; an —SiR$_3$ group wherein the R groups are the same or different and are hydrogen, $C_1$ to $C_{15}$ alkyl or alkenyl, or —SR' group wherein R' is aryl or $C_1$ to $C_{15}$ alkyl or alkenyl, aryl, and heteroaryl.

13. A device to claim 1 in which at least one Q is a surface group comprising t-butyl.

14. A method of manufacturing a light emitting device comprising the steps of providing, by solution processing, a film of at least one compound as defined claim 1 and, optionally, one or more other films to provide a laminate, adhering to one surface of the said film or laminate a substantially transparent electrode, and depositing on the other surface of the said film or laminate a metallic cathode.

15. A method according to claim 14, wherein the transparent electrode comprises indium tin oxide.

16. A method according to claim 14 wherein the metallic catrode comprises Al, Mg/Ag, or Ca.

17. A color display device including pixels comprising one or more light emitting devices as claimed in claim 1.

18. A color display device according to claim 17 wherein a substantially white or neutral background is provided by one or more of said compounds which inherently emit such a background color.

19. A semiconducting device other than a light emitting device, incorporating an element comprising at least one compound having the formula (I):

$$\text{CORE-[DENDRITE(-Q)}_a]_n \qquad (I)$$

in which CORE is a metallic chromophore which is a metalloporphyrin, n represents an integer of at least 1, Q is a proton or a surface group, a is an integer and DENDRITE, which may be the same or different if n is greater than 1, represents a conjugated dendritic structure comprising aryl and/or heteroaryl groups connected to each other via bonds between sp$^2$ hybridized ring atoms of said aryl or heteroaryl groups, CORE terminating in the first single bond which is connected to an sp$^2$ hybridized ring atom of an (hetero)aryl group to which more than one conjugated dendritic branch is attached, said atom forming part of the DENDRITE, the CORE and/or DENDRITE being luminescent, and wherein the element is obtainable by deposition using solution processing.

20. A semiconducting device according to claim 19, wherein the seminconducting device is selected from the group consisting of a photodiode, a solar cell, a FET, and a solid state triode.

* * * * *